(12) United States Patent
Dow et al.

(10) Patent No.: US 9,970,674 B2
(45) Date of Patent: May 15, 2018

(54) AUTOMATED, ADAPTIVE VENTILATION FOR A DATA CENTER

(71) Applicant: INTERNATIONAL BUSINESS MACHINES CORPORATION, Armonk, NY (US)

(72) Inventors: Eli M. Dow, Poughkeepsie, NY (US); Joseph D. Harvey, Binghamton, NY (US); Douglas E. Rohde, East Meadow, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 126 days.

(21) Appl. No.: 14/699,386

(22) Filed: Apr. 29, 2015

(65) Prior Publication Data
US 2016/0324037 A1 Nov. 3, 2016

(51) Int. Cl.
*F24F 7/00* (2006.01)
*F24F 11/00* (2018.01)
*H05K 7/20* (2006.01)

(52) U.S. Cl.
CPC ........ *F24F 11/006* (2013.01); *H05K 7/20736* (2013.01); *H05K 7/20745* (2013.01); *H05K 7/20836* (2013.01)

(58) Field of Classification Search
CPC ............. H05K 7/20709; H05K 7/2059; H05K 7/20618; H05K 7/20718
(Continued)

(56) References Cited

U.S. PATENT DOCUMENTS

| 5,505,379 A | 4/1996 | Wagner |
| 6,694,759 B1 | 2/2004 | Bash et al. |
| (Continued) | | |

FOREIGN PATENT DOCUMENTS

| CA | 2 629 383 A1 | 10/2009 |
| CN | 1626980 C | 6/2005 |
| (Continued) | | |

OTHER PUBLICATIONS

Dow, Eli M., "Automated, Adaptive Ventilation for a Data Center", U.S. Appl. No. 14/846,901, filed Sep. 7, 2015 (55 pages).
(Continued)

*Primary Examiner* — David Teitelbaum
*Assistant Examiner* — Paul Schwarzenberg
(74) *Attorney, Agent, or Firm* — Steven S. Chiu, Esq.; Kevin P. Radigan, Esq.; Heslin, Rothenberg, Farley & Mesiti, P.C.

(57) ABSTRACT

An adaptive ventilation system and method for a data center are provided. The adaptive ventilation system includes: one or more system-controlled vents facilitating dynamic redirection of airflow passing through the vent(s), and including (for instance) a plurality of adjustable louvers; and a plurality of sensors dispersed within the data center for ascertaining one or more feedback parameters within different zones of the data center. The system also includes a controller configured or programmed to automatically manage adjustment of the system-controlled vent(s) based on the ascertained feedback parameter(s) within the data center. The automatically managing includes, for instance, automatically controlling orientation of multiple louvers of the system-controlled vent(s) to dynamically facilitate a desired airflow discharge adjustment to at least one system-controlled vent based, at least in part, on the sensed feedback parameter(s) within the different zones.

16 Claims, 19 Drawing Sheets

(58) Field of Classification Search
USPC .................................................... 236/49.3
See application file for complete search history.

(56) References Cited

U.S. PATENT DOCUMENTS

| | | | | |
|---|---|---|---|---|
| 7,214,131 | B2* | 5/2007 | Malone | F24F 3/044 |
| | | | | 361/695 |
| 7,558,649 | B1 | 7/2009 | Sharma et al. | |
| 7,670,215 | B2 | 3/2010 | Klingler et al. | |
| 7,716,006 | B2 | 5/2010 | Coskun et al. | |
| 8,142,265 | B2 | 3/2012 | Carter | |
| 8,155,793 | B2 | 4/2012 | Nakajima et al. | |
| 8,483,996 | B2 | 7/2013 | Patel et al. | |
| 8,640,479 | B2* | 2/2014 | Bettella | F04D 25/12 |
| | | | | 62/186 |
| 8,744,812 | B2 | 6/2014 | Cruz | |
| 9,588,526 | B2 | 3/2017 | Boegner et al. | |
| 9,668,375 | B2 | 5/2017 | Totani et al. | |
| 2003/0158718 | A1 | 8/2003 | Nakagawa et al. | |
| 2004/0065097 | A1 | 4/2004 | Bash et al. | |
| 2004/0217072 | A1* | 11/2004 | Bash | H05K 7/20736 |
| | | | | 211/26 |
| 2006/0080001 | A1* | 4/2006 | Bash | G05D 23/1934 |
| | | | | 700/276 |
| 2007/0066213 | A1 | 3/2007 | Helgeson et al. | |
| 2007/0174024 | A1 | 7/2007 | Rasmussen et al. | |
| 2009/0156114 | A1 | 6/2009 | Ahladas et al. | |
| 2009/0222139 | A1 | 9/2009 | Federspiel | |
| 2010/0057259 | A1* | 3/2010 | Dawson | G05B 15/02 |
| | | | | 700/278 |
| 2010/0085196 | A1 | 4/2010 | Stiver et al. | |
| 2011/0107332 | A1 | 5/2011 | Bash | |
| 2011/0269389 | A1 | 11/2011 | Scharf et al. | |
| 2012/0158206 | A1 | 6/2012 | Longobardi et al. | |
| 2013/0045750 | A1 | 2/2013 | Kim et al. | |
| 2014/0121843 | A1 | 5/2014 | Federspiel et al. | |
| 2014/0355201 | A1* | 12/2014 | Alshinnawi | H05K 7/20736 |
| | | | | 361/679.47 |

FOREIGN PATENT DOCUMENTS

| | | |
|---|---|---|
| CN | 202734155 U | 2/2013 |
| EP | 2 415 310 A1 | 2/2012 |
| JP | 2011-227635 A | 11/2011 |

OTHER PUBLICATIONS

Dow, Eli M., "List of IBM Patents and/or Patent Applications Treated as Related", U.S. Appl. No. 14/699,386, filed Apr. 29, 2015, dated Mar. 10, 2016 (2 pages).

Bard et al., "Changeable, Airflow Venting Cover Assembly for an Electronics Rack", U.S. Appl. No. 14/606,118, filed Jan. 27, 2015 (47 pages).

Dow et al., Office Action for U.S. Appl. No. 14/846,901, filed Sep. 7, 2015 (U.S. Patent Publication No. 2016/0320082 A1), dated Oct. 26, 2017 (19 pages).

* cited by examiner

AUTOMATED, ADAPTIVE VENTILATION FOR A DATA CENTER

BACKGROUND

The power dissipation of integrated circuit chips, and the modules containing the chips, continues to increase in order to achieve increases in processor performance. This trend poses cooling challenges at the node, rack and data center levels. Increased airflow rates may be needed to effectively cool higher power components and to control the temperature of egressing air exhausted into the computer center.

In many large server applications, processors along with their associated electronics (e.g., memory, disk drives, power supplies, etc.) are packaged in removable drawer configurations stacked within a rack or frame. In other cases, the electronics may be at fixed locations within the rack or frame. Typically, the components are cooled by air moving in airflow paths, usually front-to-back, impelled by one or more air moving devices (e.g., axial or centrifugal fans). In some cases it may be possible to handle increased power dissipation within a single drawer or node by providing greater airflow, through the use of a more powerful air moving device(s) or by increasing the rotational speed (i.e., RPMs) of an existing air moving device. However, this approach may be problematic at the rack or data center level.

BRIEF SUMMARY

In one aspect, the shortcoming of the prior art are overcome and additional advantages are provided through the provision of an apparatus comprising an adaptive ventilation system for a data center containing a plurality of electronics racks. The adaptive ventilation system includes, for instance: at least one system-controlled vent, the at least one system-controlled vent being adjustable to facilitate dynamic redirection of airflow passing therethrough; a plurality of sensors dispersed within the data center for ascertaining at least one feedback parameter within different zones of the data center; and a controller automatically managing adjustment of the at least one system-controlled vent based on the ascertained at least one feedback parameter within the data center, the automatically managing including automatically providing at least one desired airflow discharge adjustment to the at least one system-controlled vent based, at least in part, on the ascertained at least one feedback parameter.

In another aspect, a data center is provided which includes a plurality of electronics racks and an adaptive ventilation system. The plurality of electronics racks are, at least partially, air-cooled via airflow passing therethrough from an air inlet side to an air outlet side. The adaptive ventilation system includes: at least one system-controlled vent, the at least one system-controlled vent being adjustable to facilitate dynamic redirection of airflow passing therethrough; a plurality of sensors dispersed within the data center for ascertaining at least one feedback parameter within different zones of the data center; and a controller automatically managing adjustment of the at least one system-controlled vent based on the ascertained at least one feedback parameter within the data center, the automatically managing comprising automatically providing at least one desired airflow discharge adjustment to the at least one system-controlled vent based, at least in part, on the ascertained at least one feedback parameter.

In a further aspect, a method is provided which includes providing adaptive ventilation for a data center having a plurality of electronics racks. The providing of adaptive ventilation includes: providing at least one system-controlled vent, the at least one system-controlled vent facilitating dynamic redirection of airflow passing therethrough; providing a plurality of sensors dispersed within the data center for ascertaining at least one feedback parameter within different zones of the data center; and providing a controller automatically managing adjustment of the at least one system-control vent based on the ascertained at least one feedback parameter within the data center, the automatically managing comprising automatically providing at least one desired airflow discharge adjustment to the at least one system-controlled vent based, at least in part, on the ascertained at least one feedback parameter.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects are particularly pointed out and distinctly claimed as examples in the claims at the conclusion of the specification. The foregoing and objects, features, and advantages of one or more aspects of the invention are apparent from the following detailed description taken in conjunction with the accompanying drawings in which:

DETAILED DESCRIPTION

Recent trends in addressing data center operations have placed increased focus on improving overall operating efficiencies, including cooling efficiencies. A significant contributor in this regard is associated with the supply of ambient cool air and the subsequent removal of egressing heated air generated within the data center's electronics racks, or information technology (IT) infrastructure. Note that electronics rack, rack unit, rack, IT infrastructure are used interchangeably herein, and unless otherwise specified, include any housing, frame, support, structure, compartment, etc. having one or more heat generated components of a computer system, electronics system, IT system, etc. Note also that reference is made below to the drawings, which may not be drawn to scale to facilitate an understanding of the invention, where the same reference numbers used throughout different figures designate the same or similar components.

Figure 1:
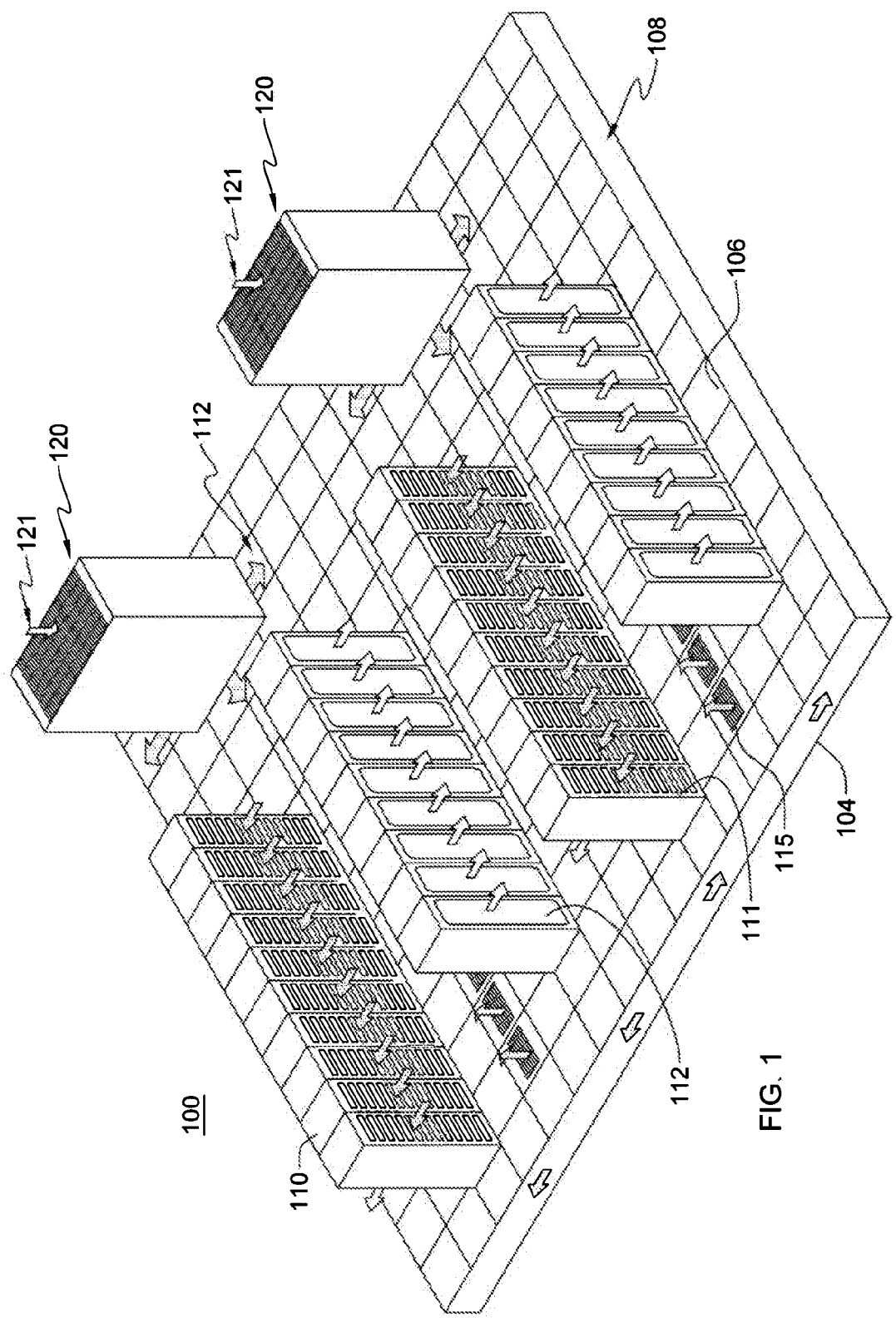
FIG. 1 depicts one embodiment of a raised-floor layout of an air-cooled data center to include an adaptive ventilation system, in accordance with one or more aspects of the present invention.

By way of example, one embodiment of an air cool data center 100 is depicted in FIG. 1. As shown, in a raised floor layout of air-cooled data center 100, multiple electronics racks 110 may be disposed in one or more rows. A computer installation such as depicted may house several hundred, or even several thousand processors. In the arrangement of FIG. 1, chilled air enters the computer room via floor vents from a supply air plenum 108 defined between a raised floor 106 and a base or sub-floor 104 of the room. Cooled air is taken in through the front or air inlet sides 111 of the electronics racks and expelled through the back, or air outlet sides 112, of the electronics racks. Each electronics rack 110 may have one or more air-moving devices (e.g., axial or centrifugal fans) to provide forced inlet-to-outlet airflow to cool the electronic components within the rack. Supply air plenum 108 provides conditioned and cooled air to the air-inlet sides of the electronics racks via perforated floor tiles 115 disposed (in one embodiment) in a "cold" air aisle of the data center. The conditioned and cooled air is supplied to plenum 108 by one or more air-conditioning units 120, which may also be disposed within data center 100. Room air 121 is taken into each air-conditioning unit 150 near an upper portion thereof. In the depicted embodiment, this room air comprises in part exhausted air from the "hot" air aisles of the data center defined by opposing air outlet sides 112 of electronics racks 110.

Due to ever increasing airflow requirements through the electronics racks, and the limits of air distribution within the typical computer room installation, such as the above-described, raised-floor environment of FIG. 1, or alternatively, a non-raised-floor environment, hot zone and/or recirculation problems within the room may occur. For instance, recirculation can occur because the conditioned air supplied may be only a fraction of the airflow rate forced through the electronics racks by the air moving devices disposed within the racks. This can be due, for example, to limitations on fixed vent airflow rates. The remaining fraction of the supply of inlet side air may be made up by ambient room air through recirculation, for example, from the air outlet side of the rack unit to the air inlet side. This re-circulating flow is often very complex in nature, and can lead to significantly higher rack inlet temperatures than might be expected.

Recirculation of hot exhaust air from the hot aisle of the computer room installation to the cold aisle can be detrimental to the performance and reliability of the computer system(s), or electronic system(s), within the rack(s). Data center equipment is typically designed to operate with rack air inlet temperatures in the 15-35° C. range. For a layout such as depicted in FIG. 1, however, temperatures can range from 15-20° C. at the lower portion of a rack, close to the cool air floor vents, to as much as 32-42° C. at the upper portion of the electronics rack, where hot air can form a self-sustaining recirculation loop. Since the allowable rack heat load is limited by the rack inlet air temperature at the "hot" part, this temperature distribution correlates to an inefficient utilization of available air conditioning capability. Computer installation equipment almost always represents a high capital investment to the customer. Thus, it is of significant importance, from a product reliability and performance view point, and from a customer satisfaction and business perspective, to better facilitate airflow control within a data center.

Data center designers have implemented cold aisle/hot aisle layouts to compartmentalize airflow requirements within a data center. Although theoretically optimized, such an implementation has been problematic given that hot zone and airflow recirculation issues may occur, and given the heterogeneous nature of installed IT or rack content within the data center. As one solution, various attempts have been made to implement cold aisle/hot aisle containment structures, such as containment barriers at the end of a cold aisle or hot aisle extending upwards, for instance, to the ceiling of the data center. Although proving to be effective, concerns remain with respect to a data center with heterogeneous IT content. For instance, IT content can vary between racks, from racks with relatively inherently low velocity horizontal air flow to those with high-velocity directed airflow, each exiting into a hot aisle of a data center. By definition, the exiting air may be either in the same or in opposing directions, depending on the equipments' location, with the worst case scenario being when high velocity horizontal airflow from one side of a hot-air-aisle adversely effects airflow through an opposing rack by impinging on a lower velocity airflow emanating from the opposing electronics rack, possibly negatively effecting its operational characteristics. To address these deficiencies, and to assist in both optimizing data center layouts and airflow balancing, the ability to dynamically redirect, or vectorize, airflows discharging into the one or more cold-air-aisles, and airflows exiting the electronics racks into, for instance, a hot-air-aisle of a data center, is disclosed herein in order to, for instance, assist in improving control of overall data center airflow cooling efficiency.

Figure 2:
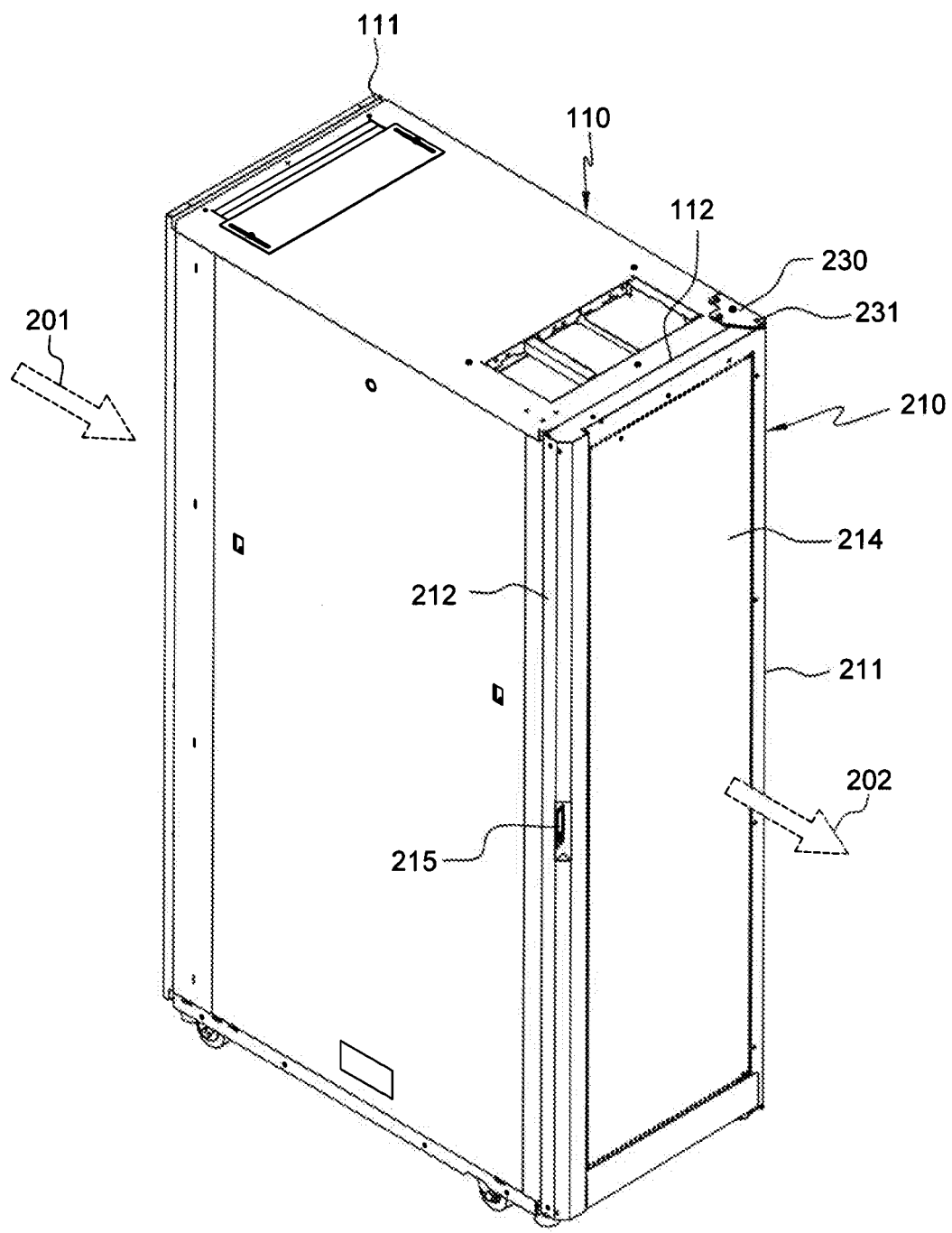
FIG. 2 depicts one embodiment of an air-cooled electronics rack, which may be fitted with one or more adjustable exhaust vents of an adaptive ventilation system, in accordance with one or more aspects of the present invention.

By way of further example, FIG. 2 depicts one embodiment of an electronics rack 110 with an air exhaust door 210 mounted at a vertical hinge edge 211 to the electronics rack, for instance, at the air outlet side 112 of the electronics rack, where cool airflow 201 ingresses via air inlet side 111 of electronics rack 110 and heated exhaust air 202 egresses via air outlet side 112 thereof. In this embodiment, air exhaust door 210 is sized to substantially cover air outlet side 112 of electronics rack 110. As shown, air exhaust door 210 includes, in addition to hinge edge 211, a vertically extending latch edge 212 located opposite to hinge edge 211, and an inner side (not shown) and an outer side 214, which are opposite main sides of air exhaust door 210. In the embodiment depicted, the inner side of air exhaust door 210 is disposed closer to air outlet side 112 of electronics rack 110, with air exhaust door 210 mounted to the rack via top and bottom hinge brackets 230 and hinge pins 231 located at or adjacent to hinge edge 211 of air exhaust door 210. As illustrated, hinge pins 231 may be positioned close to outer side 214 of air exhaust door 210 so that the hinge axis is out from electronics rack 110 to, at least in part, minimize or even eliminate outward swing of air exhaust door 210 past the sides of electronics rack 110 as the air exhaust door is rotated between closed and opened positions. A door latch mechanism 215 may be disposed (in one embodiment) at or adjacent to latch edge 212, and be configured to facilitate latching of air exhaust door 210 to electronics rack 110 when in the closed position, as illustrated in FIG. 2. Perforated screens may be provided at either the inner side or the outer side 214 of air exhaust door 210, through which the heated exhaust air 202 flows laterally out.

Figure 3:
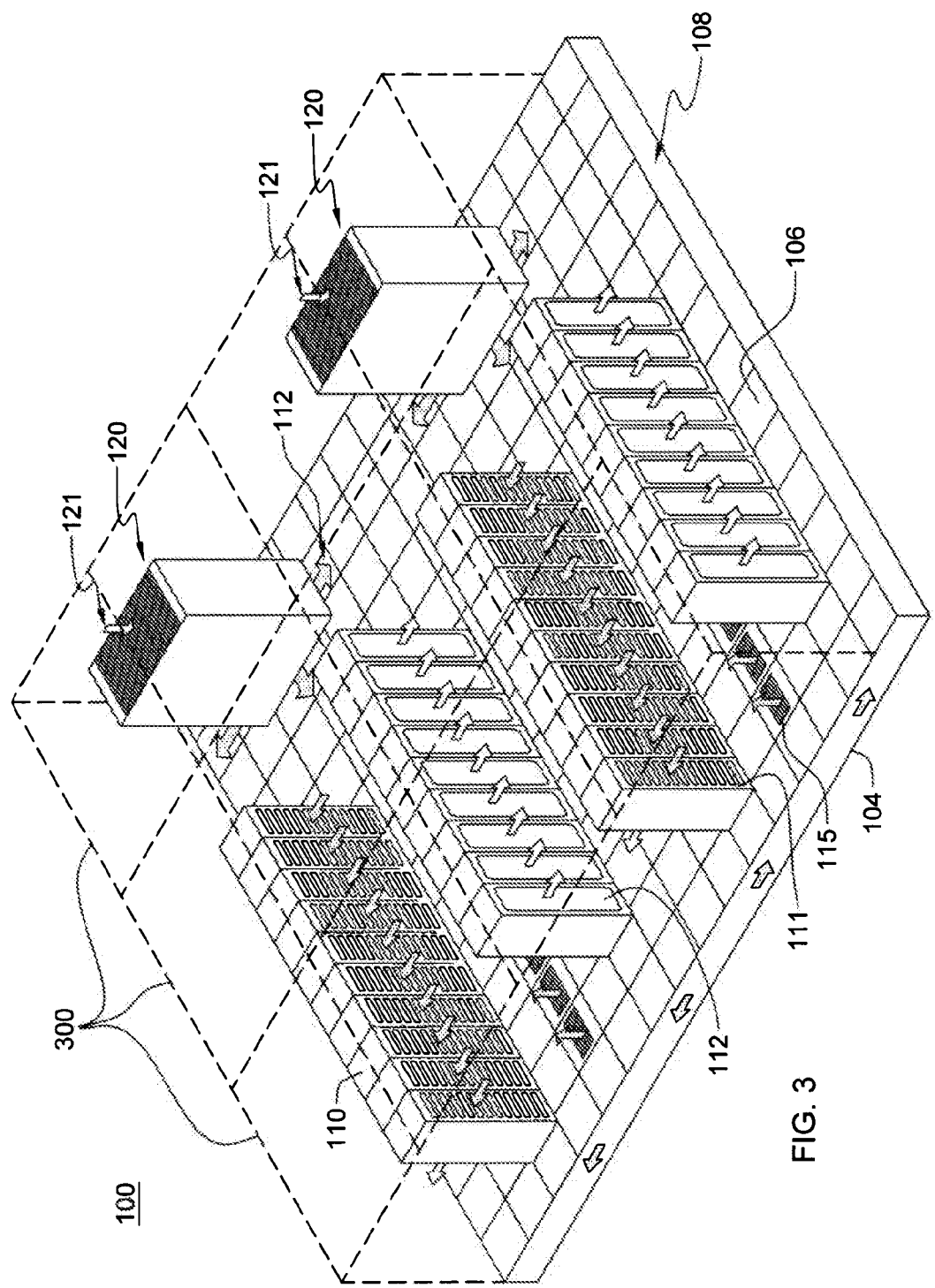
FIG. 3 depicts the air-cooled data center of FIG. 1, segmented into different zones for automated control, by an adaptive ventilation system, of one or more vents within the different zones of the data center, in accordance with one or more aspects of the present invention.

FIG. 3 depicts air-cooled data center 100 of FIG. 1, with the data center divided into multiple zones 300 or regions for separate airflow evaluation and handling by an adaptive ventilation system such as described herein. Air-cooled data center 100 may be divided into any number of zones 300, depending on the desired airflow control gradation for the data center. Within each airflow zone 300, one or more sensors of the adaptive ventilation system may be provided to monitor one or more feedback parameters. Depending upon the values of the feedback parameters, which may be measured values or averaged values for a particular zone 300 of the data center 100, decisions are automatically made by the adaptive ventilation system to dynamically adjust one or more system-controlled vents of the system. Note that as used herein, system-controlled vent refers to any adjustable vent which may be automatically controlled, including, for instance, motor-controlled vents or electronically-adjustable vents.

As noted, configuring a data center with hot-air-aisles and cold-air-aisles may not by itself solve all data-cooling issues. For instance, pockets of hot air can still develop within different zones of the data center. Further, static vents, such as static, cool-air vents, do not adapt to runtime changes in temperature or, for instance, workload spikes in different locations of the data center. Rack systems and servers within the racks may each have different, time-varying cooling requirements, which may not be accounted for in a uniformly distributed air-cooled data center.

Thus, generally stated, provided herein are apparatuses and methods which comprise an adaptive ventilation system for a data center containing, for instance, a plurality of electronics racks. The adaptive ventilation system includes, for instance, one or more system-control vents which facilitate dynamically redirecting airflow passing therethrough. The ventilation system further includes a plurality of sensors dispersed within the data center for ascertaining at least one feedback parameter within different zones of multiple zones of the data center. A controller is provided which is configured or programmed to automatically manage adjustment of the one or more system-controlled vents based on the ascertained parameter(s) within the data center. The automatically managing may include, for instance, automatically controlling orientation of multiple louvers of a plurality of louvers of the system-controlled vent(s) to dynamically facilitate at least one desired airflow discharge adjustment to one system-controlled vent of the at least one system-controlled vent based, at least in part, on the ascertained at least one feedback parameter.

In one or more implementations, the controller may automatically manage adjustment of the system-controlled vent(s) based on changes in the ascertained feedback parameter(s) over time within at least one zone of the data center. For instance, if temperature spikes within a particular zone of the data center, then one or more system-controlled vents associated with that zone may be dynamically adjusted to, for instance, facilitate providing additional cool airflow to the identified zone(s) with the higher temperature value(s).

In certain implementations, the controller may automatically, periodically poll the plurality of sensors for current values of the at least one feedback parameter within the different zones of the data center, and based thereon, determine whether to automatically provide the at least one desired airflow discharge adjustment to the at least one system-controlled vent. For instance, this may involve updating a topology of the at least one feedback parameter maintained by the controller. By way of example, the at least one feedback parameter may include at least one of temperature within the data center and/or the electronics racks, speed of air-moving devices within the plurality of electronics racks, or workload data for the plurality of electronics racks of the data center. Further, in certain embodiments, the controller may determine the at least one desired airflow discharge adjustment to at least one of optimize a distribution of cool air supply within at least one cold-air-aisle of the data center, or optimize a hot air exhaust pattern within at least one hot-air-aisle of the data center.

In one or more embodiments, the adaptive ventilation system includes multiple system-controlled vents within a data center. The controller identifies at least one zone of multiple zones within the data center which has a feedback parameter value outside a desired range. The parameter value may be, in one or more implementations, the actual, sensed parameter value or, for instance, an averaged sensed parameter value where multiple sensors may be provided within the particular zone. The controller automatically determines for the at least one zone the at least one desired airflow discharge adjustment to one or more system-controlled vents within the at least one zone of the data center.

By way of example, the multiple system-controlled vents may include multiple adjustable cool air supply vents for the data center, and the plurality of sensors may be dispersed within the different zones of the data center to sense, at least in part, temperature within different zones of the data center. In such implementations, the controller may automatically determine whether a temperature value of the at least one zone of the data center is outside a desired temperature range. For instance, if the controller automatically determines that the temperature value is above the desired temperature range, then based thereon, the controller may identify one or more adjustable cool air supply vents of the multiple system-controlled vents for adjustment, for instance, within the at least one zone, and automatically adjust the one or more cool air supply vents within the at least one zone to facilitate lowering the temperature value within that zone of the data center.

In one or more implementations, the multiple system-controlled vents of the adaptive ventilation system may include multiple adjustable exhaust vents associated with one or more electronics racks of the plurality of electronics racks. In this implementation, the controller may automatically determine whether to adjust one or more adjustable exhaust vents of the one or more electronics racks within the at least one zone based on an ascertained feedback parameter value near or associated with the one or more electronics racks. For instance, the controller may automatically adjust one or more adjustable exhaust vents to adjust orientation of exhausting air into a hot-air-aisle from the one or more racks when velocity of exhausting airflow is above a set threshold. By way of example, the one or more feedback parameters may include RPMs of one or more air-moving devices associated with the one or more electronics racks.

As a further example, the at least one system-controlled vent of the adaptive ventilation system may include at least one adjustable cool air supply vent for the data center, and the automatically managing by the controller may include automatically modifying orientation of multiple louvers of one adjustable cool air supply vent of the at least one adjustable cool air supply vent to change a supply of cool air to at least one of a first electronics rack and a second electronics rack of the plurality of electronics racks. For instance, the first and second electronics racks may be opposing electronics racks across a cold-air-aisle of the data center. In such an implementation, the first electronics rack and the second electronics rack may have different cooling requirements based, at least in part, on the sensed feedback parameter, and the controller may automatically adjust the one adjustable cool air supply vent to distribute more cool air to, for instance, the higher-heat-producing rack, such as the first electronics rack, than to the second electronics rack. For instance, the one adjustable cool air supply vent may include multiple regions of louvers, and the automatically managing by the controller may include differently orienting louvers in a first region and a second region of the multiple, separately adjustable regions of louvers of the one changeable cool air supply vent based, at least in part, on the sensed feedback parameter. The differently orienting may allow more cool air to discharge through one of the first region or the second region than the other of the regions, dependent on the identified cooling adjustment to be made.

Advantageously, the efficient use of the cold air supplied to a data center reduces system operating costs, increases system lifespan, and increases system efficiency and throughput. Disclosed herein are adaptive ventilation systems which, in one or more implementations, provide multi-zone climate control within the data center. Multiple sources of feedback for the control system or controller may be provided. For instance, temperature sensors, such as thermal diodes, may be provided both inside and external to the electronics racks or the systems housed within the racks. Additionally, fan speeds within the racks or systems within the racks may be provided to the controller, as well as, for instance, system load and workload details to, for instance, ascertain dynamically an amount of heat flux being generated within the different electronics racks of the data center.

The adaptive ventilation systems and methods disclosed herein advantageously allow, in one or more implementations, for any form of statistics and/or feedback to be used to automatically, dynamically adjust, in real-time, vents across the data center in response to identified trends in the statistics and/or feedback information.

As explained herein, using, for instance, servos, sensors, peer-to-peer networking (or centralized control), as well as, for instance, a thermal topology modeler in conjunction with workload analytics, the adaptive ventilation systems and methods disclosed can dynamically apply cooler air where needed in real-time to mitigate identified hot zones within a data center. In one or more implementations, the motor-controls or servos of the vents may be or include linear actuators. For operating, for instance, sun blade or louver-type vents, a rack or linear-type actuator may be used, with the total movement required determining the stroke and the actuator to be selected. For ceiling-type vents, actuators with sufficient power to support the weight of the vents may be employed. Exemplary adaptive ventilation systems and control methods are described below with reference to FIGS. 4-11.

Figure 4:
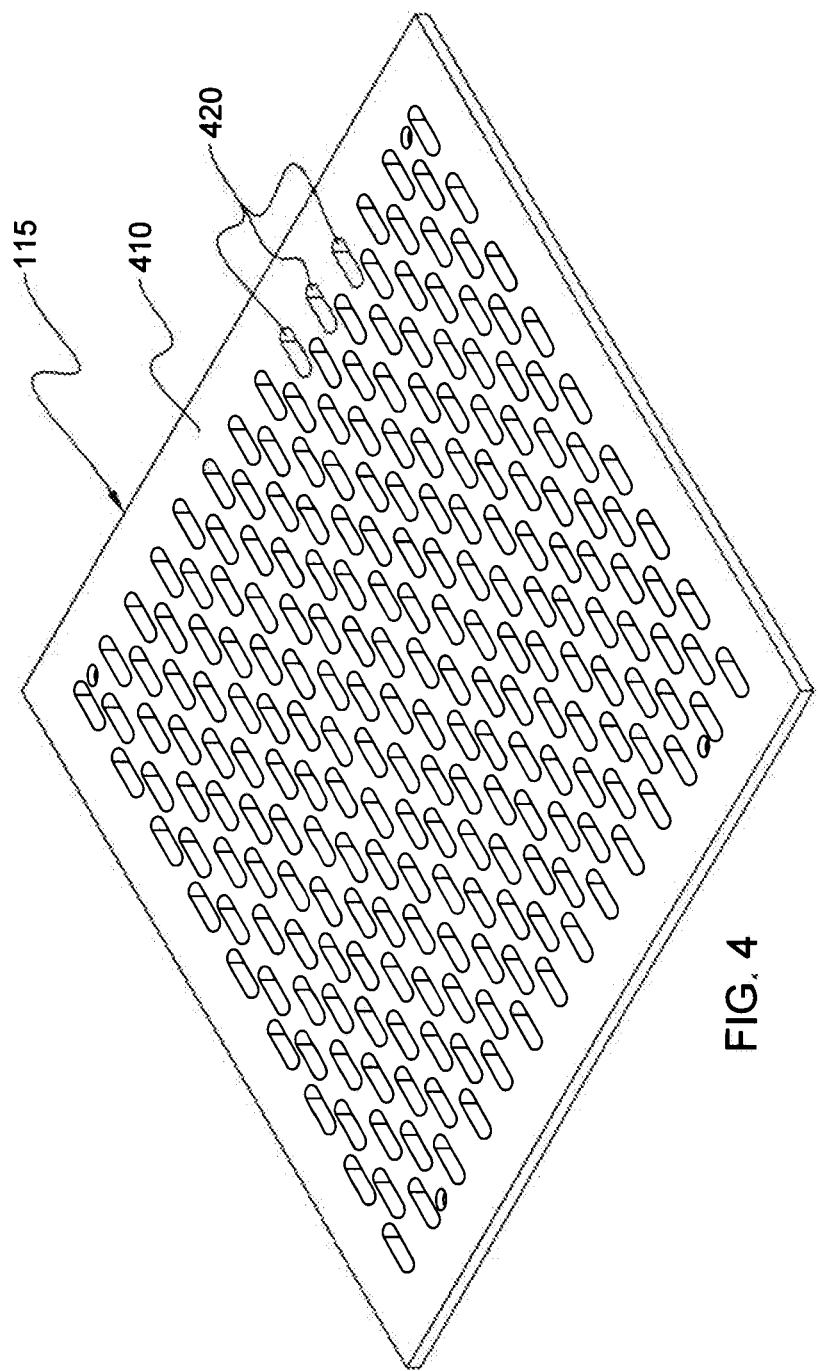
FIG. 4 is an isometric view of one embodiment of a vent comprising a perforated floor tile to be modified, in accordance with one or more aspects of the present invention.

FIG. 4 depicts one embodiment of a perforated floor tile 115 for use, for example, in a raised-floor layout such as depicted in FIG. 1. Perforated floor tile 115 includes a solid structural portion 410, which is designed to support a specified weight, and openings 420, which function as conduits for airflow from the under-floor plenum, into the data center room. Openings 420 may make up a variable percentage of perforated floor tile 115. For example, openings 420 may comprise 5% to 60%, or more, of the surface area of perforated floor tile 115. In one embodiment, perforated floor tile 115 is a rectangular, metal structure. In accordance with one or more aspects, the adaptive ventilation systems disclosed herein may associate system-controlled vents with the perforated cool air supply tiles or screens of the data center, which as noted, may be (in one or more implementations) perforated floor tiles 115. Alternatively, the perforated tiles of the data center providing the cool air may be replaced by the system-controlled vents disclosed herein, with an appropriate support structure or screening provided over the system-controlled vent where desired, for instance, within a raised-floor implementation such as depicted in FIGS. 1 & 3 (as opposed to an overhead cool air implementation).

Figure 5A:
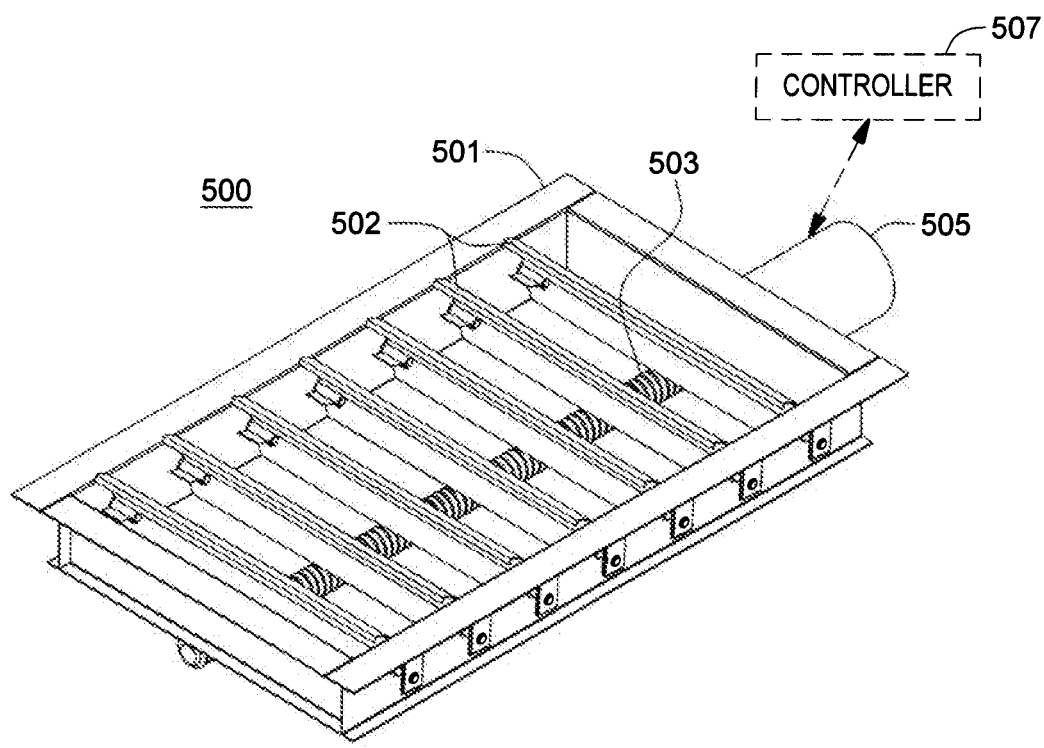
FIG. 5A depicts one embodiment of a system-controlled vent of an adaptive ventilation system, in accordance with one or more aspects of the present invention.
Figure 5B:
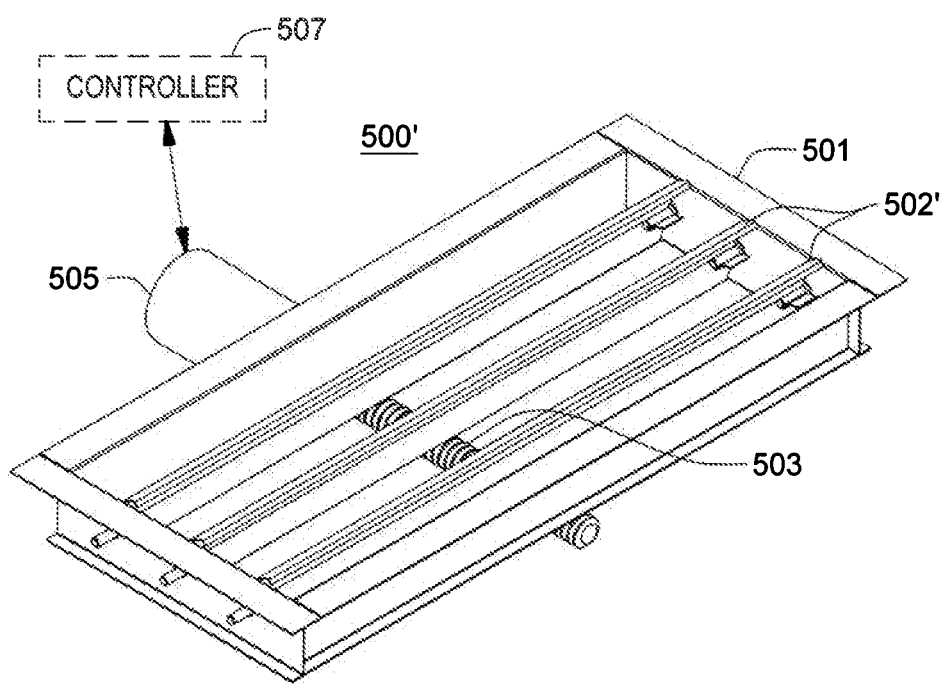
FIG. 5B depicts another embodiment of a system-controlled vent of an adaptive ventilation system, in accordance with one or more aspects of the present invention.
Figure 5C:
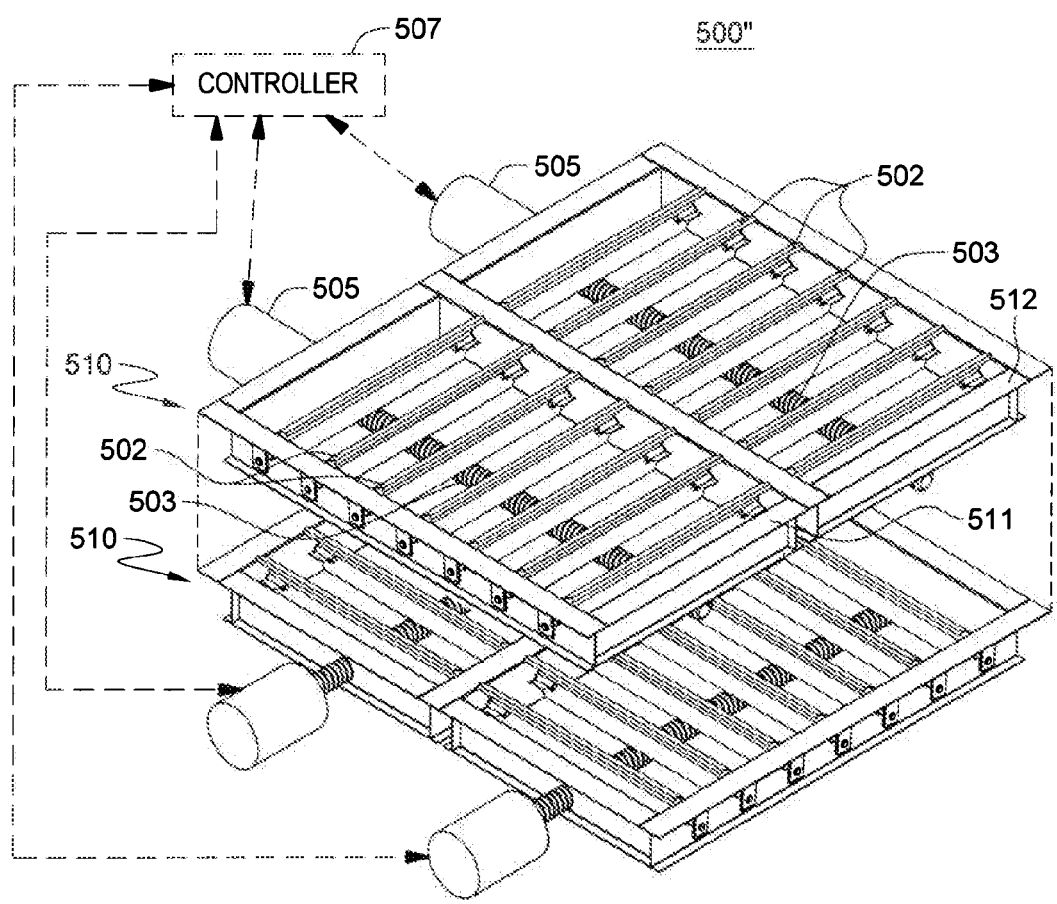
FIG. 5C depicts a further embodiment of a system-controlled vent, such as an adjustable cool air supply vent, of an adaptive ventilation system, in accordance with one or more aspects of the present invention.

FIGS. 5A-5C depict exemplary embodiments of system-controlled vents, in accordance with one or more aspects of the present invention.

In FIG. 5A, a system-controlled vent 500 is depicted which includes a support structure 501, a plurality of adjustable louvers 502, a control arm 503 coupled to the plurality of adjustable louvers 502, and an actuator 505 coupled to control arm 503 for dynamically adjusting orientation of multiple louvers 502 of system-controlled vent 500. In one or more implementations, system-control vent 500, and in particular, actuator 505 communicates with or is addressable by a controller or control system of the adaptive ventilation system using, for instance, wireless technology. Alternatively, actuator 505 may be hard-wired to the adaptive ventilation system controller 507 in order to allow the controller 507 to automatically, selectively adjust orientation of louvers 502 of system-controlled vent 500 to achieve the desired ventilation changes within the data center.

FIG. 5B depicts a modification of the system-controlled vent 500 of FIG. 5A. In FIG. 5A, system-controlled vent 500 includes horizontally-articulated louvers, while in FIG. 5B, a system-controlled vent 500' is presented having vertically-articulated louvers 502'. In this embodiment, an appropriate control arm 503, such as a worm drive, controls the orientation of the multiple adjustable louvers 502' of system-controlled vent 500' as driven by actuator 505 and controller 507 of the adaptive ventilation system.

As noted, in one or more implementations, the system-controlled vent may comprise multiple, separately adjustable regions of louvers to, for instance, separately direct different amounts of cool air from an adjustable cool air supply vent to different electronics racks supply by the cool air supply vent. In FIG. 5C, two system-controlled vents 510 are shown offset 90° and overlaid to create a plurality of different regions of adjustable louvers for, for instance, an adjustable cool air supply vent 500" of an adaptive ventilation system such as described herein. As illustrated, each system-controlled vent 510 includes a first region 511 and a second region 512 having separately adjustable louvers 502. In one embodiment, the separately adjustable louvers 502 in the different regions 511, 512 are adjusted via respective control arms 503 and actuators 505. As with the embodiments described above, actuators 505 are controlled via controller 507 of the adaptive ventilation system to provide dynamic changes in airflow discharge from the system-controlled vent 500".

Note that various configurations of system-controlled vents may be employed in the adaptive ventilation system disclosed herein, with the embodiments of FIGS. 5A-5C being provided by way of example only. In general, the system-controlled vents are adjustable vents which may be electronically or motor-adjusted, and include a servo or, for instance, a stepping motor, and/or a microcontroller, as well as a network interface, for communicating with the adaptive ventilation system controller 507 or control system. The system-controlled vents may be sent instructions by the controller with details about how to adjust the respective louvers or regions of louvers of the vent to achieve a desired airflow adjustment through the vent.

Figure 6A:
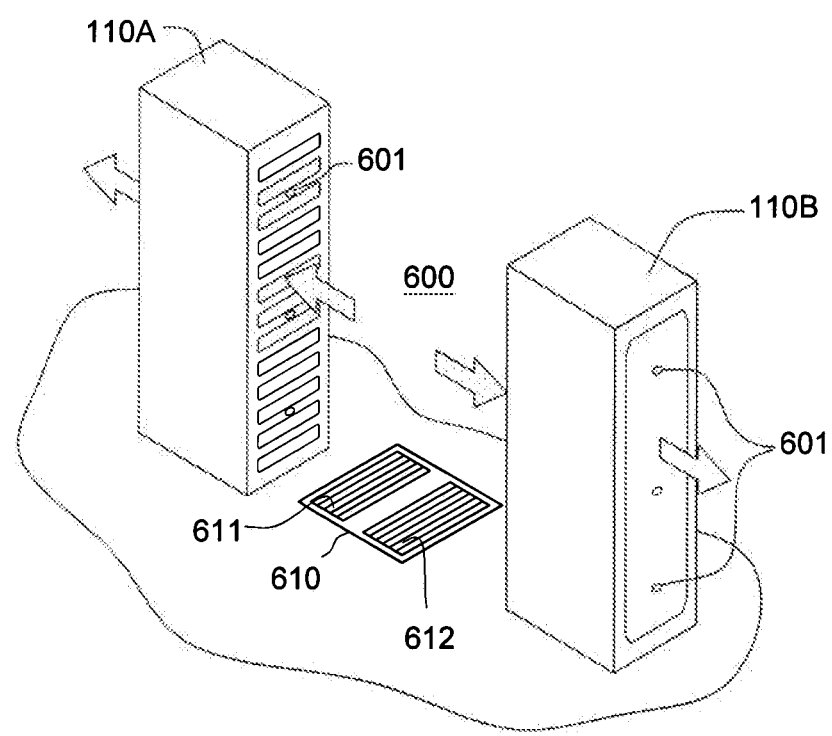
FIG. 6A is a partial illustration of a cold air aisle of a data center, with a first electronics rack spaced apart from and positioned opposite to a second electronics rack, and with an adjustable cool air supply vent of an adaptive ventilation system disposed between the first and second electronics racks, in accordance with one or more aspects of the present invention.

FIG. 6A is a partial depiction of a data center cold-air-aisle 600 defined, in part, by a first electronics rack 110A and a second electronics rack 110B disposed on opposite sides of cold-air-aisle 600. As illustrated, one or more adjustable cool air supply vents 610 may be provided within cold-air-aisle 600 to provide cool air, at least in part, to first and second electronics racks 110A, 110B. Although depicted as a floor vent, the one or more adjustable cool air supply vents could be, for instance, one or more ceiling vents providing cool air into cold-air-aisle 600 of the data center. The floor vents depicted and described herein are presented as one example only of the concepts disclosed.

In one or more implementations, adjustable cool air supply vent 610 includes at least two separately adjustable regions of louvers 611, 612 for, for instance, independently adjusting orientation of louvers providing cool air to each of the first and second electronics racks 110A, 110B. Also, as illustrated in FIG. 6A, the data center may include a plurality of sensors 601 dispersed throughout the data center, for example, at the air-inlet and air-outlet sides of the electronics racks within the data center. In one or more implementations, the sensors include temperature sensors disposed external and/or internal to the plurality of electronics racks of the data center. For instance, one or more temperature sensors may be associated with the electronic systems, servers, processors, etc., disposed within the electronics racks of the data center. In addition to sensing temperature, load measurements for the systems within the electronics racks may also be ascertained and provided to the adaptive ventilation system controller. The controller may use this temperature data to generate a temperature-based topology for the data center from which to automatically determine desired airflow discharge adjustments for the data center.

If multiple sensors are provided within a particular zone or region of the data center, or within or associated with a particular electronics rack, then one or more of the sensor readings may be averaged to obtain, for example, an average rack temperature, an average system utilization value, an average fan speed, etc., which may be used by the adaptive ventilation system controller in proactively making ventilation changes within the data center. For instance, the first and second electronics rack 110A, 110B may be "assigned" the depicted adjustable cool air supply vent 610 disposed therebetween to provide the majority of their cool air supply, and the controller may automatically evaluate, for instance, one or more temperatures associated with the first and second electronics racks 110A, 110B, or one or more processing loads, or fan speeds, of the first and second electronics racks in order to ascertain whether an airflow discharge adjustment through adjustable cool air supply vent 610 is to be made.

If one of the racks is processing a high load, then in one or more embodiments the region of louvers 611, 612 providing cool air to that electronics rack may be automatically adjusted by the system controller to provide an increased amount of cool air to that rack, for instance, by fully opening the louvers of the applicable region. A moderate processing load on one of the electronics racks may mean that the associated vent is adjusted so that the applicable louver region is only partially open, while a minimal or no load at a rack may mean that the louvers providing cool air to that electronics rack may be nearly closed.

Figure 6B:
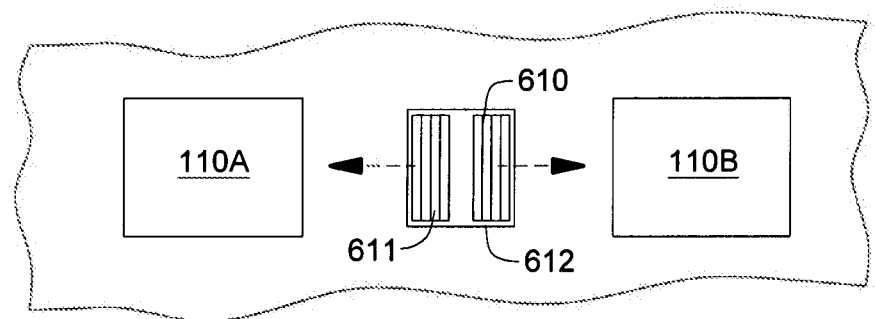
FIG. 6B is a top plan view of the opposing electronics racks of FIG. 6A, illustrating cool air supply from an adjustable cool air supply vent of an adaptive ventilation system under normal or low-processing load at the first and second electronics racks, in accordance with one or more aspects of the present invention.
Figure 6C:
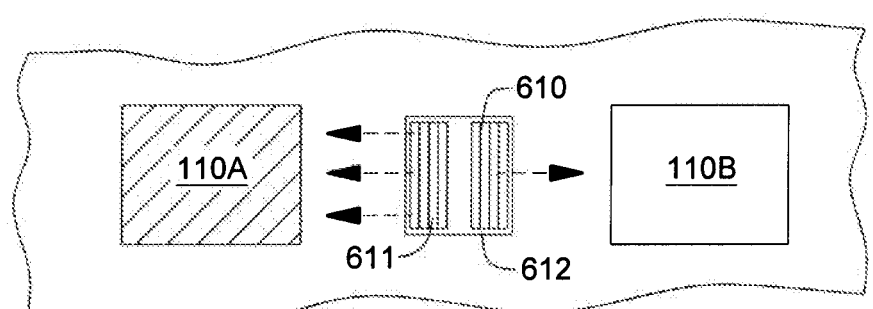
FIG. 6C depicts the assembly of FIG. 6B, with the adjustable cool air supply vent being automatically adjusted to provide a higher cool airflow to one electronics rack, based on one or more ascertained feedback parameters indicating that the one electronics rack is producing a higher heat load, in accordance with one or more aspects of the present invention.
Figure 6D:
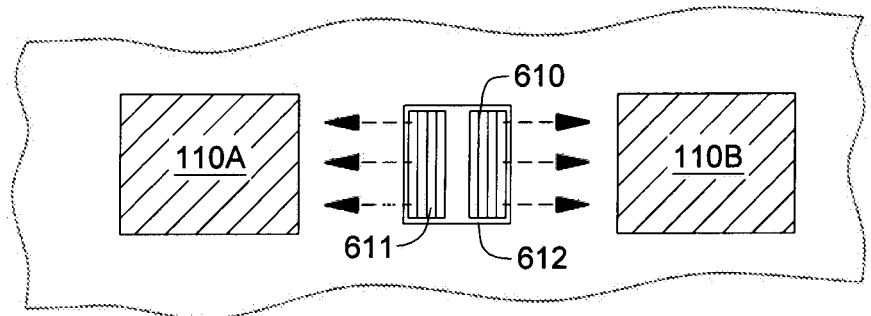
FIG. 6D depicts the assembly of FIGS. 6B & 6C, with a higher heat load being identified in both electronics racks, and with the adjustable cool air supply vent of the adaptive ventilation system being automatically adjusted to discharge an increased amount of cool air to both electronics racks, in accordance with one or more aspects of the present invention.

FIGS. 6B-6D depict in greater detail exemplary vent control of an adaptive ventilation system such as disclosed herein. These figures represent a plan view of FIG. 6A, showing first electronics rack 110A and second electronics rack 110B, with adjustable cool air supply vent 610 disposed therebetween. As noted, adjustable cool air supply vent 610 includes a first louver region 611 and a second louver region 612, which are separately, independently adjustable so as to allow the adaptive ventilation system controller to separately control the amount of cool air being provided to the first and second electronics racks 110A, 110B.

In FIG. 6B, first and second electronics racks 110A, 110B are assumed to be under no or minimal load, and the adjustable louvers of the first and second louver regions 611, 612 are oriented substantially closed, or at least closer to closed than open. In FIG. 6C, first electronics rack 110A is identified by the feedback to the controller to be under a full processing load. By way of example, the feedback could comprise CPU temperature(s) within the electronics rack, air exhaust temperature(s) from the electronics rack, RPMs of one or more air-moving devices within the electronics rack, or other feedback data representative of workload state within the electronics rack. As illustrated in FIG. 6C, the adjustable louvers in louver region 611 providing cool airflow to first electronics rack 110A are automatically actuated to full open, or closer to full open, while in this example, the adjustable louvers within louver region 612 remain closer to closed. In FIG. 6D, both first and second electronics racks 110A, 110B are identified by the controller as performing a full processing load, and therefore, generating high heat flux. In this case, louvers in louver region 611 and in louver region 612 are automatically adjusted by the controller, for instance, to full open position, to provide an increased or maximum amount of cool airflow to the air inlet sides of the respective electronics racks 110A, 110B.

Figure 7A:
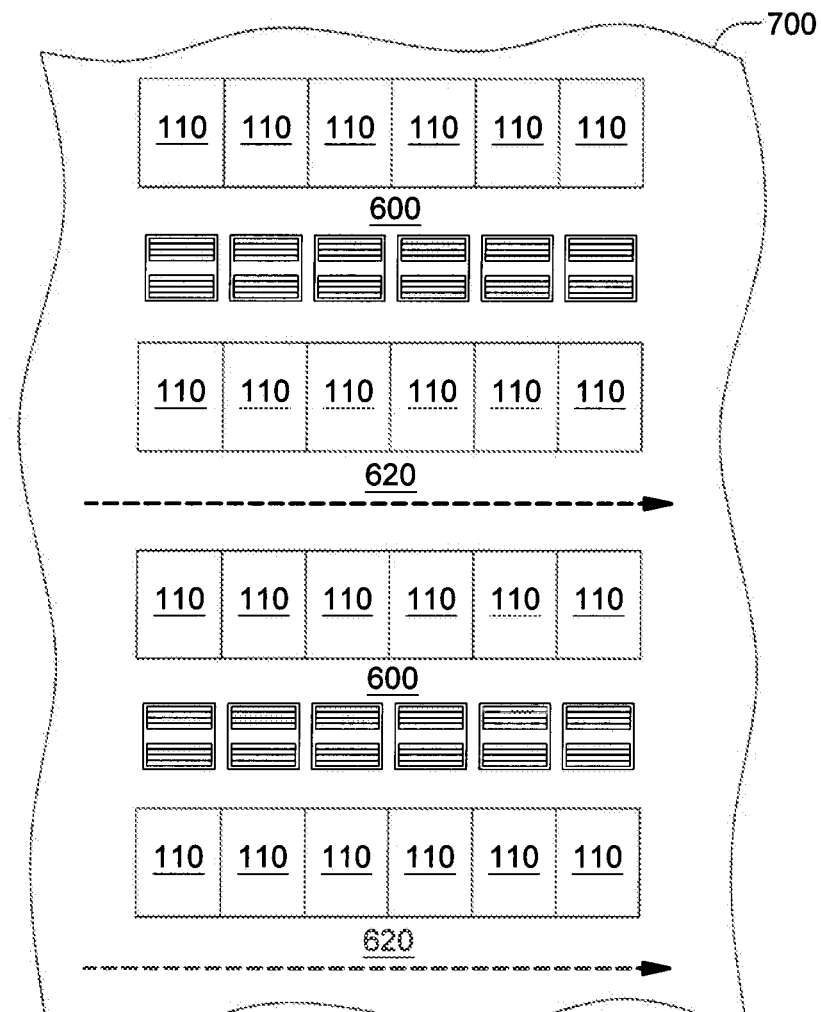
FIG. 7A is a partial plan view of one embodiment of an air-cooled data center, illustrating an alternating cold-air-aisle, hot-air-aisle arrangement of the electronics racks, wherein multiple adjustable cool air supply vents of an adaptive ventilation system are disposed within the cool-air-aisles of the data center, in accordance with one or more aspects of the present invention.
Figure 7B:
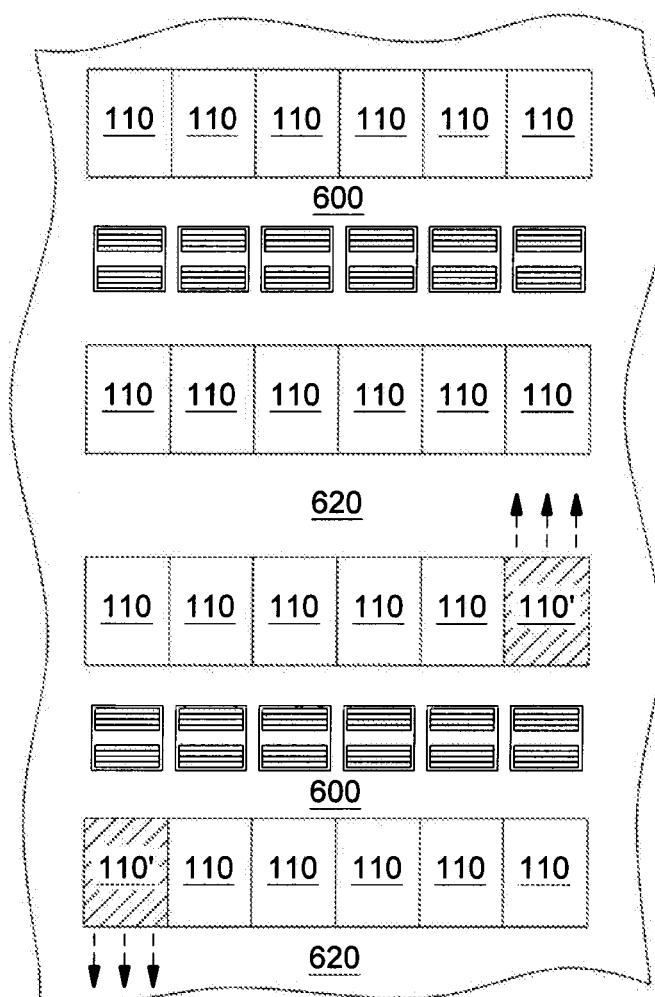
FIG. 7B depicts the partial data center representation of FIG. 7A, with one or more electronics racks being identified as processing a heavy load and generating excessive heat, the excessive heat to be automatically mitigated by the adaptive ventilation system, in accordance with one or more aspects of the present invention.
Figure 7C:
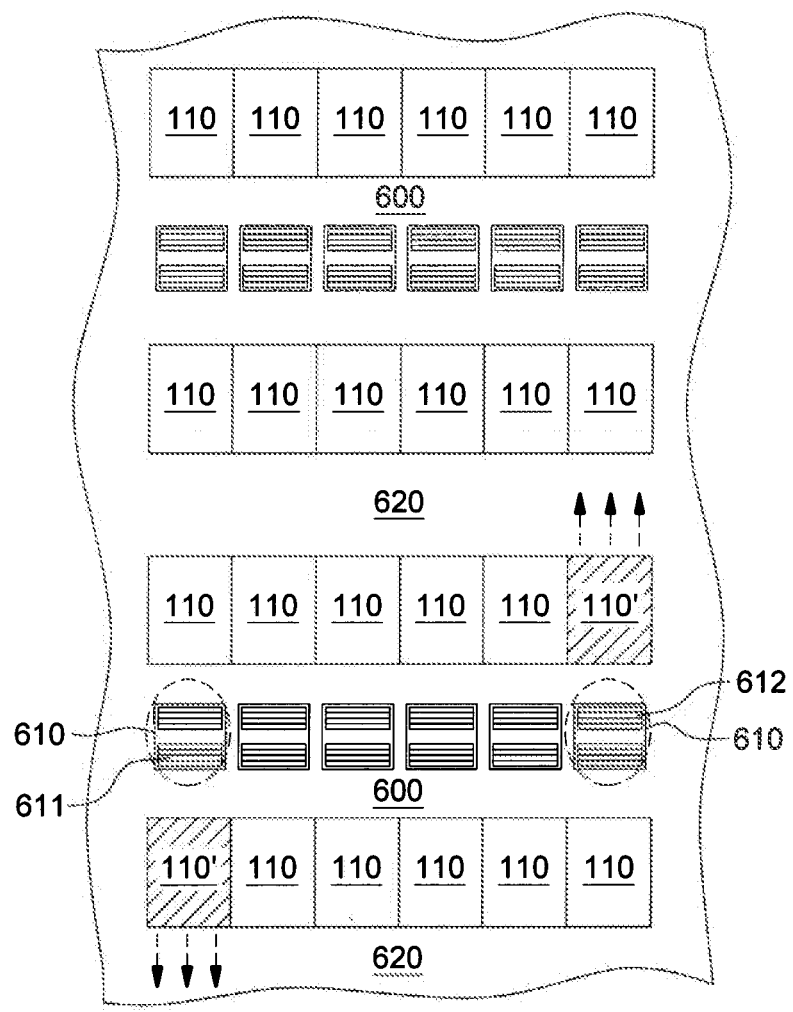
FIG. 7C depicts the partial data center representation of FIG. 7B, with one or more adjustable cool air supply vents of the adaptive ventilation system being identified and automatically adjusted in order to facilitate proving additional cool air to the identified heavy load electronics racks, in accordance with one or more aspects of the present invention.

FIGS. 7A-7C depict examples of this concept extended to multi-rack or multi-zone climate control. In FIG. 7A, a partial plan view of one embodiment of an air-cooled data center 700 is illustrated with alternating cold-air-aisles 600 and hot-air-aisles 620. As depicted, a plurality of electronics racks 110 may be aligned in rows to define the alternating cold-air and hot-air-aisles 600, 620. In FIG. 7A, electronics racks 110, or systems within the racks, may be idle or have minimal load supplied. In FIG. 7B, the data center of FIG. 7A is illustrated, with two of the electronics racks 110' highlighted as being under a heavy processing load and dissipating a higher heat load into respective hot-air-aisles 620 of the data center. As illustrated in FIG. 7C, the adaptive ventilation system controller identifies the zones or electronics racks 110' with the heavier processing load and responds, in one or more embodiments, by adjusting louvers of the associated adjustable cool air supply vents 610 so as to dynamically increase the amount of cool air being provided to the air inlet sides of those electronics racks 110'. For instance, the respective regions of louvers 611, 612 of the identified adjustable cool air supply vents 610 associated with electronics racks 110' may be opened more to allocate a greater amount of cool air to electronics racks 110' to, for instance, moderate the exhaust temperature exiting from those racks.

Note that the adaptive ventilation system presented herein may have access to data representative of the data center topology. For instance, location of electronics racks within the data center could be provided to the adaptive ventilation system by a system administrator or, for instance, the adaptive ventilation system could itself determine topology of the data center using known methods for locating nodes or racks in a network. The locations of the racks may be plotted by the adaptive ventilation system onto a topology representation of the data center with reference points within the data center. Note that the adjustable cool air supply vents may themselves be provided with an interface capability to act as reference points in the data system topology employed by the adaptive ventilation system. These air supply vents may act as reference points by which locations of electronics racks can be plotted. In one or more implementations, the locations of the adjustable cool air supply vents remain constant within the data center, and thus, can act as reliable reference points.

Note also that various cooling strategies may be implemented by an adaptive ventilation system such as disclosed herein. For instance, in the example of FIGS. 6A-6D, workload-based monitoring may be employed to dynamically adjust the cool air supply to particular electronics racks within the data center. Alternatively, a localized hot spot or zone within the data center may be identified, for instance, at the air exhaust sides of the high-heat-flux-producing racks using, for instance, feedback from one or more temperature sensors at the exhaust sides of the racks of the data center. Using this strategy, short-term hot spot mitigation may be performed quickly by dynamically readjusting, for instance, the airflow patterns of the data center in order to divert cool air where needed, and heated away from identified hot spots. This can be accomplished through adjustments in the cool air supply, and, for instance, diverting exhausting air to cooler locations within the associated hot air exhaust aisles, even if it should contradict an overall airflow pattern of the data center.

Figure 8A:
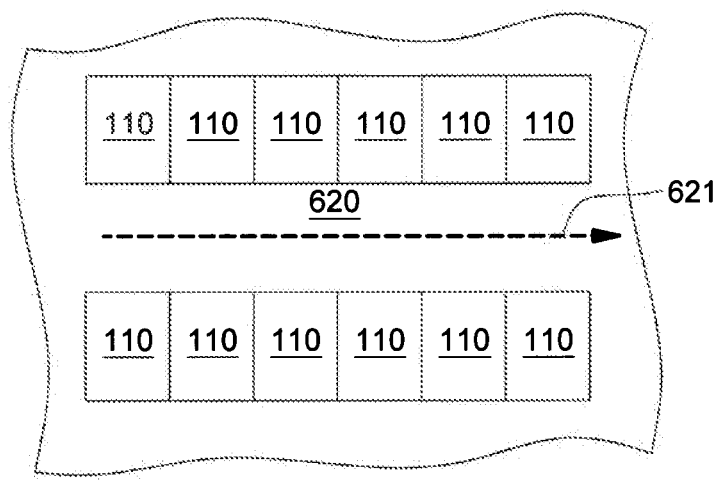
FIG. 8A is a partial depiction of a hot-air-aisle of a data center to incorporate adjustable exhaust vents of an adaptive ventilation system, in accordance with one or more aspects of the present invention.

FIGS. 8A-8E depict a further aspect of an adaptive ventilation system, in accordance with one or more aspects of the present invention. In FIG. 8A, a top plan view of a hot-air-aisle 620 of a data center is illustrated, defined between two rows of electronics racks 110, each with their air outlet sides oriented towards hot-air-aisle 620. As depicted, in one example, exhausting airflow 621 is to flow generally left-to-right down the hot-air-aisle 620, for instance, towards a computer room air-conditioning unit (not shown).

Figure 8B:
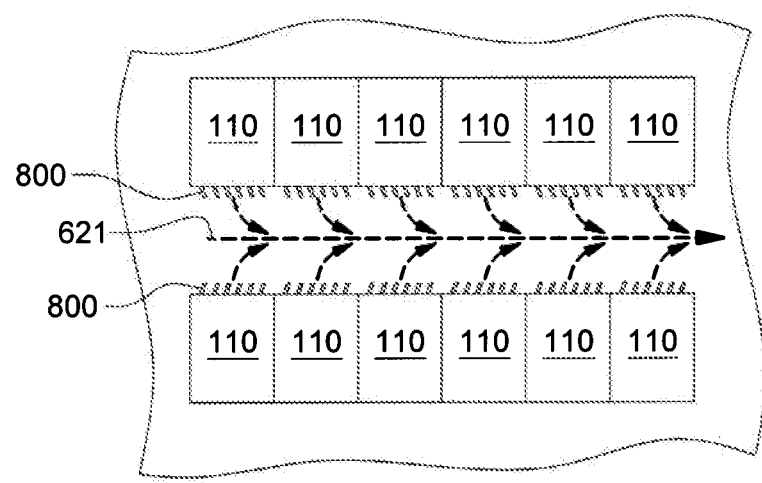
FIG. 8B partially depicts the hot-air-aisle of FIG. 8A, with opposing electronics racks shown, by way of example, with fixed louvers at the air outlet sides thereof directing exhausting heated airflow in a fixed direction into the hot-air-aisle, in accordance with one or more aspects of the present invention.
Figure 8C:
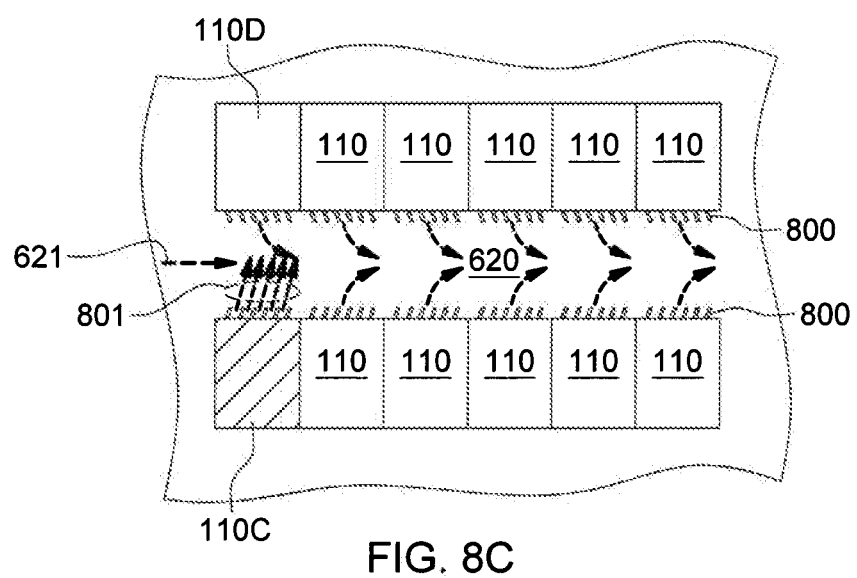
FIG. 8C depicts the assembly of FIG. 8B, with one electronics rack of the illustrated electronics rack producing a high-heat load and generating excessive exhaust airflow discharge into the hot-air-aisle towards the opposing electronics rack, which is to be mitigated in accordance with one or more aspects of the present invention.

In FIG. 8B, the air outlet sides of electronics racks 110 are provided with fixed louvers 800 which facilitate directing the exhausting airflow from the respective electronics rack in the desired airflow direction 621 down hot-air-aisle 620. This configuration may be acceptable where, for instance, air-moving devices within the respective electronics racks are operating at a specified or normal operating speed, or below. However, as illustrated in FIG. 8C, should one of the electronics racks 110C be processing a heavy workload, then RPMs of the air-moving device(s) within that electronics rack may be increased to provide a desired amount of cooling. This may result in an increased exhaust airflow 801 at the air outlet side of electronics rack 110C, which could potentially interfere with exhausting air from the opposing electronics rack 110D. For instance, airflow 801 from electronics rack 110C towards electronics rack 110D may be sufficient to partially block airflow from exhausting from electronics rack 110D, resulting in inefficient venting from the rack into hot-air-aisle 620.

Figure 8D:
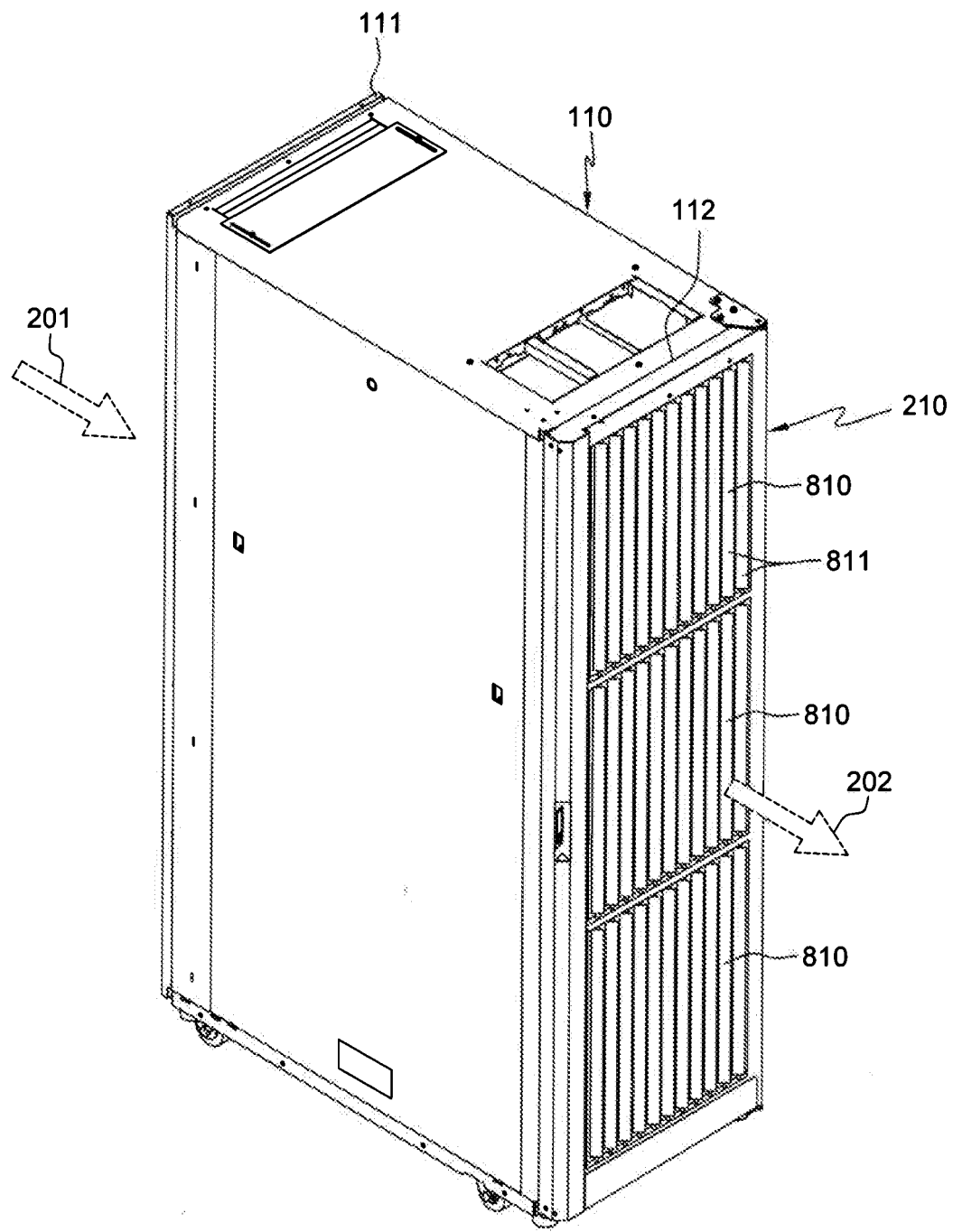
FIG. 8D depicts one embodiment of an air-cooled electronics rack having one or more adjustable exhaust vents of an adaptive ventilation system located at the air outlet side thereof, in accordance with one or more aspects of the present invention.

One solution to this problem is depicted in FIG. 8D, where one or more regions of adjustable exhaust vents 810 are provided at the air outlet side of electronics rack 110 of FIG. 2. For instance, each electronics rack 110 of the data center may have at least one adjustable exhaust vent 810 covering the air outlet side thereof. In one or more implementations, each adjustable exhaust vent 810 is a system-controlled vent of the adaptive ventilation system disclosed herein, and includes (for instance) and actuator interface to the system controller and a plurality of adjustable louvers that allow directional adjustment of the airflow exhausting from the electronics rack. In certain implementations, one or more of the regions of adjustable exhaust vents 810 have a plurality of vertically-oriented louvers 811 that may be adjustable 180° left-right to allow the adaptive ventilation system to directionally control how airflow is exhausted from the particular electronics rack of the data center. Note that different regions of adjustable exhaust vents may be advantageous where the electronics rack contains different types of systems or subsystems in different regions of the electronics rack, for instance, in a lower region, a middle region, and an upper region. In other configurations, a single adjustable exhaust vent 810 may be provided and substantially occupy the entire air outlet side of an electronics rack.

Figure 8E:
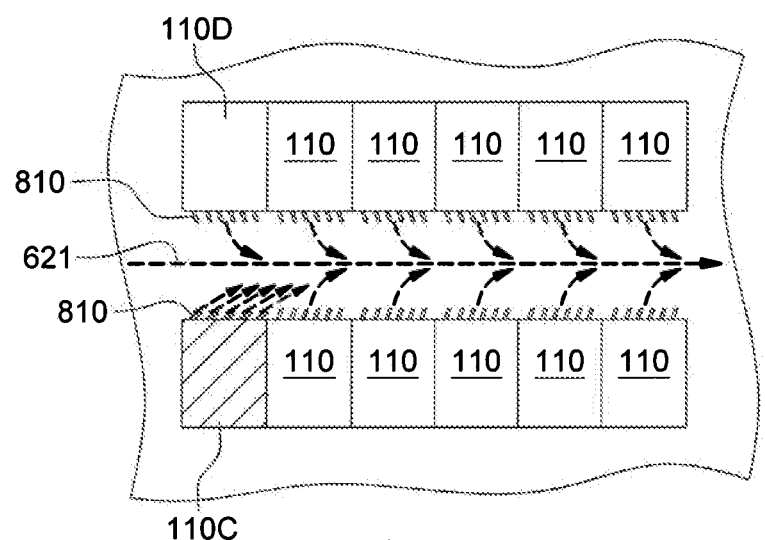
FIG. 8E is a partial depiction of the hot-air-aisle of FIG. 8A and showing one or more adjustable exhaust vents associated with the higher-heat-producing electronics rack being automatically adjusted by the adaptive ventilation system to redirect exhausting airflow from the one electronics rack in a more desired airflow direction into the hot-air-aisle of the data center, in accordance with one or more aspects of the present invention.

In FIG. 8E, the electronics racks of the data center are provided with adjustable exhaust vents 810 of an adaptive ventilation system, such as described herein. The adaptive ventilation system, and more particularly, the controller of the adaptive ventilation system, identifies the electronics rack 110C with the higher exhaust flow at the air outlet side, for instance, by monitoring speed of air-moving devices within the individual racks, and automatically adjusts orientation of the louvers of the adjustable exhaust vent 810 to, for instance, better direct the airflow in the desired airflow direction 621 in the hot-air-aisle 620 of the data center.

Thus, in one or more implementations, the adaptive ventilation system controls both system-controlled vents in the cold-air-aisles and system-controlled vents (i.e., adjustable exhaust vents) exhausting heated air into the hot-air-aisles of the data center to dynamically optimize airflow patterns within the data center, both in the cold-air-aisles and the hot-air-aisles of the data center. In conjunction with obtaining the feedback parameters for the data, the controller sends instructions to specific system-controlled vents of the system via appropriate network communication connections, indicating how the discharging airflow should be adjusted to fit a desired cooling strategy for the data center.

Note that the controller of the adaptive ventilation system may automatically identify the hot-air-aisles and cold-air-aisles of the data center using, for instance, thermal sensors dispersed throughout the data center and/or associated with the racks, or the chassis, blades, nodes, subsystems, switches, etc., associated with the electronics rack within the data center to provide temperature information about the data center and racks. This temperature data can be supplied in real-time to the controller implementing, for instance, centralized thermal management control. As noted, the electronics racks can optionally include associated temperature sensors at their air inlet sides and/or air outlet sides, rather than relying on temperature readings internal to the electronics racks. Depending on the embodiment desired, the controller is able to receive temperature readings from the respective temperature sensors, or poll the sensors for current temperature values.

Figure 9:
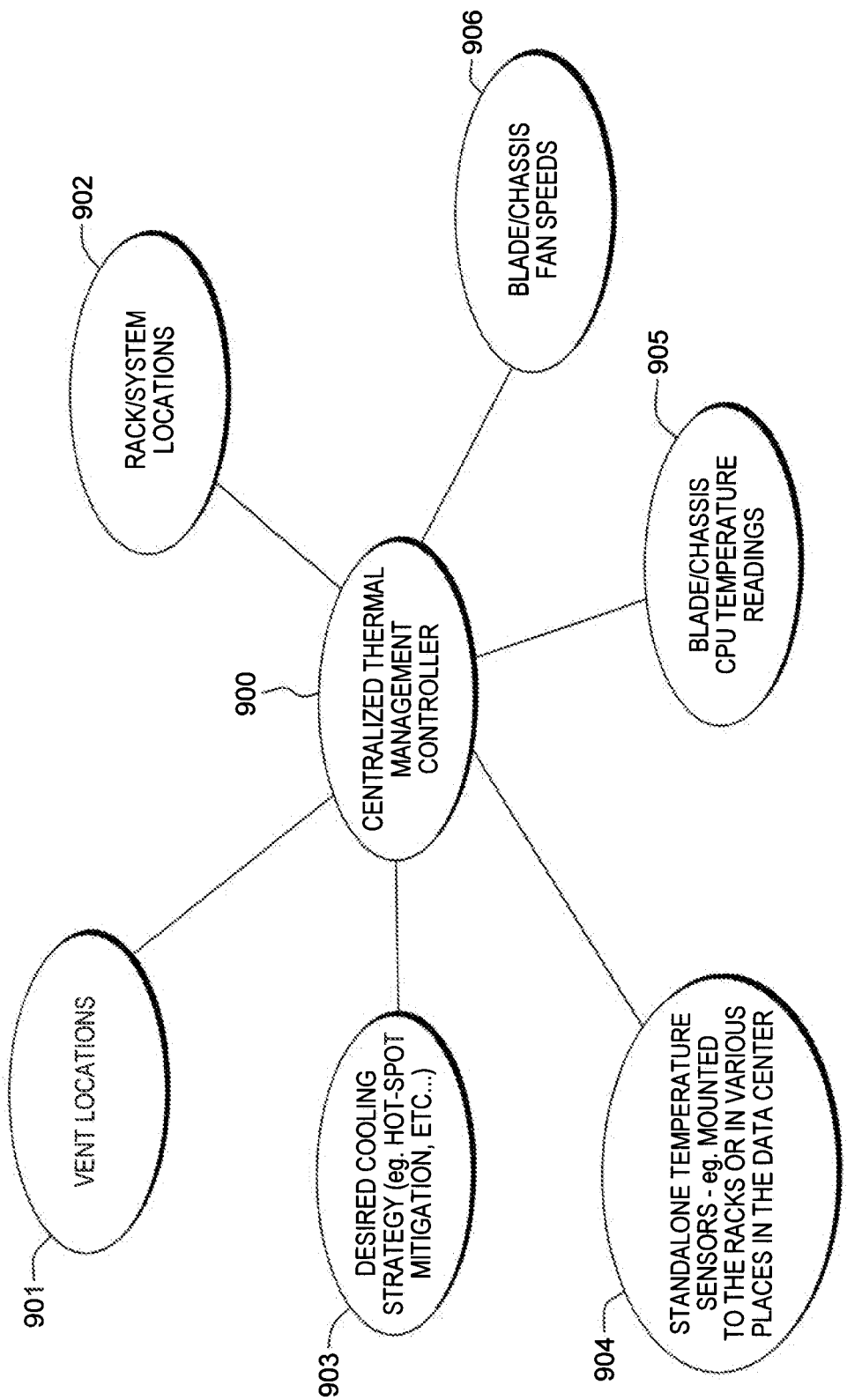
FIG. 9 depicts one embodiment of a centralized thermal management controller of an adaptive ventilation system, and exemplary information available to the centralized thermal management controller, in accordance with one or more aspects of the present invention.

FIG. 9 illustrates one example of information provided to a centralized thermal management controller 900 of an adaptive ventilation system such as disclosed herein. As illustrated, centralized thermal management controller 900 has access to information on the location of the system-controlled vents 901 within the data center, as well as locations of the electronics racks or systems 902 within the data center. Further, centralized thermal management controller 900 is provided with a desired cooling strategy 902.

By way of example, hot spot mitigation could be a desired cooling strategy, wherein stressed systems or electronics racks are cooled as quickly as possible. When specific electronics racks are under heavy load, the airflow pattern of the data center may be at least temporarily disrupted in order to divert additional cooling the critically hot electronics rack(s). This can be accomplished through one or more adjustments of the cool air supply vents and, for instance, by diverting higher-flow exhaust air from the hot electronics racks to the coolest spot within the hot-air-aisle(s) of the data center, even if the action contradicts an overall airflow pattern of the data center. In another strategy, control of overall convection could be desired, where local hot spots are not as important as maintaining a consistent, overall airflow within the data center, notwithstanding changes in speed of air-moving devices within the respective electronics racks. In this case, exhaust vectors at the air outlet side of the electronics racks may be adjusted in smaller increments to create uniform airflow within the hot-air-aisle(s) of the data center. This strategy is advantageous when the systems or electronics racks are under similar loads. As a further strategy, the centralized thermal management controller could additionally employ migration of virtual machines to cooler electronics racks to mitigate temperature spikes and/or hot spots within the data center.

One or more various additional feedback parameters or readings may be provided using a plurality of sensors connected to the centralized thermal management controller 900. For instance, stand-alone temperature sensors 904 may be dispersed throughout the data center, for example, in different zones of the data center. In certain implementations, one or more temperature sensors may be added at the air inlet side and/or air outlet side of one or more electronics racks of the data center. Additionally, temperature readings may be obtained by polling existing temperature sensors associated with blades, chassis, subsystems or nodes of the individual electronics racks with the data center. For instance, CPU temperature readings 905 may be ascertained and used by the centralized thermal management controller 900. Other workload management data may be directly provided from the individual systems within the data center to centralized thermal management controller 900 of the adaptive ventilation system, if desired. Note that the adaptive ventilation systems described herein could also incorporate or integrate with workload forecasting in order to anticipate airflow redirection needs. For instance, if an available workload forecasting technique forecasts that one or more electronics racks within a data center will run a scheduled heavy workload at the same time every day, then the adaptive ventilation system may begin to redirect airflow to provide optimal cooling to those one or more electronics racks substantially at the same time that the heavy workload commences, rather than wait for, for example, a hot spot to be identified. As further illustrated in FIG. 9, air-moving device speeds 906 may also be provided to or polled by centralized thermal management controller 900 to ascertain, for instance, a representation of exhaust air flow rate from the air outlet sides of the electronics racks within the data center.

Figure 10A:
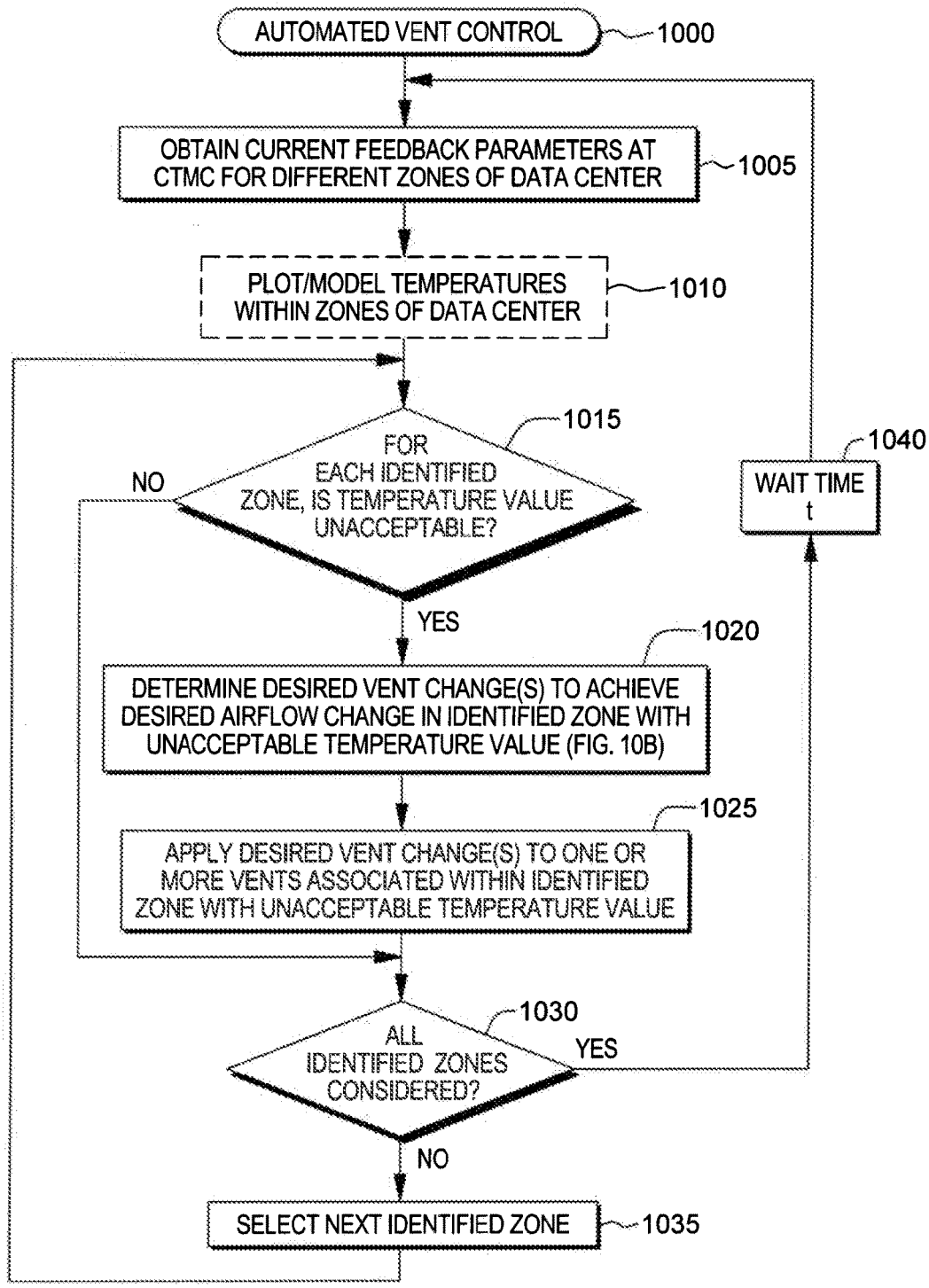
FIGS. 10A & 10B depict one embodiment of automated processing implemented by a centralized thermal management controller of an adaptive ventilation system, in accordance with one or more aspects of the present invention.
Figure 10B:
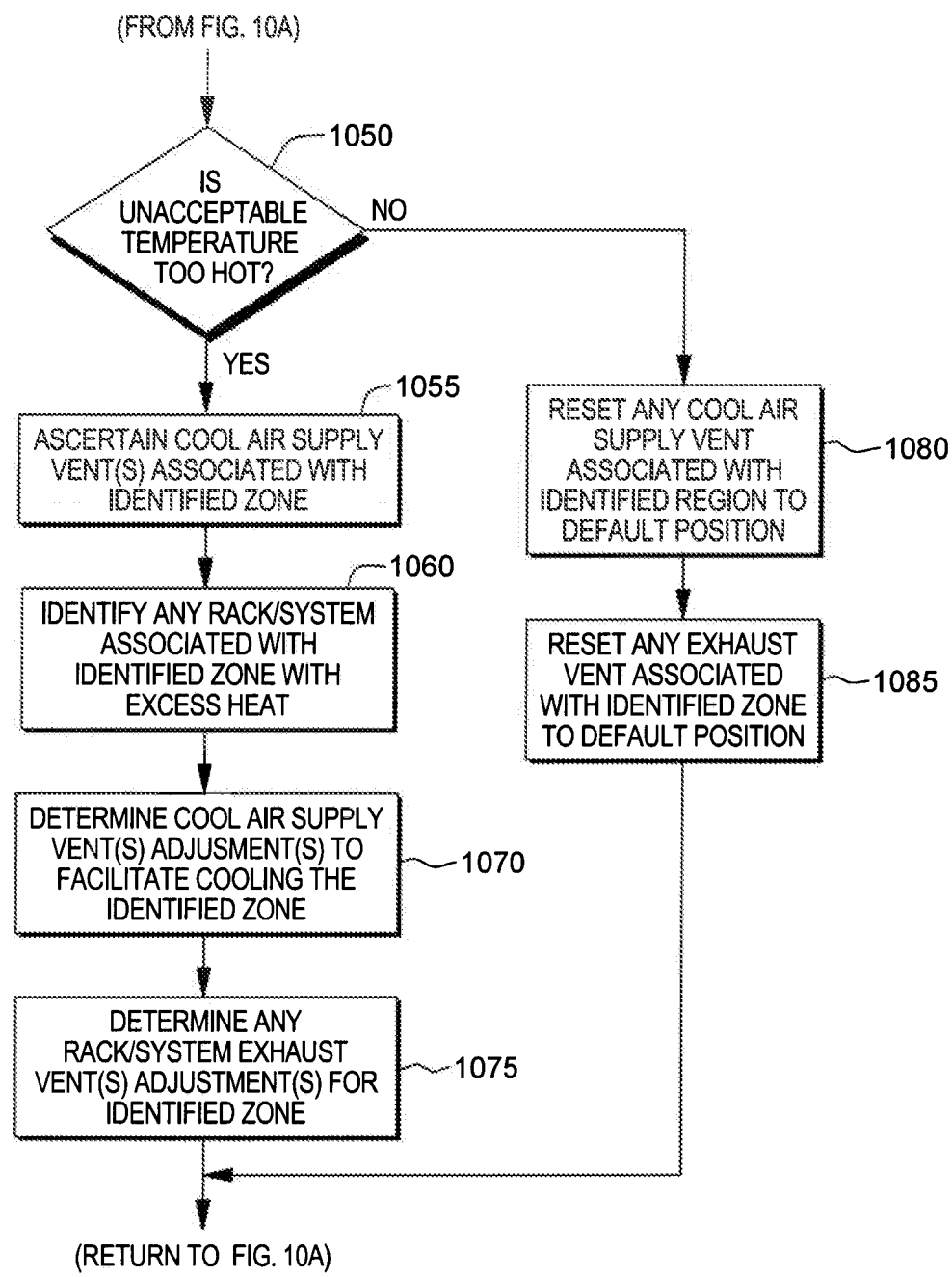

FIGS. 10A & 10B depict one embodiment of automated vent control processing implemented by the controller of an adaptive ventilation system such as disclosed herein. The automated vent control 1000 example illustrated includes obtaining current feedback parameter values at the centralized thermal management controller (CTMC) for the different zones of the data center 1005. By way of example, the current feedback parameters may comprise sensed temperature values throughout the data center. The controller may optionally plot or model temperatures within the zones of the data center 1010. In this example, for each identified zone of the data center, the controller determines whether the temperature value is unacceptable 1015. For instance, the controller may determine whether the particular temperature value is outside a set temperature range. If "yes", then (in one or more embodiments) the controller determines a desired vent change to achieve a desired airflow change in the identified zone with the unacceptable temperature value 1020, one embodiment of which is depicted in FIG. 10B.

Referring to FIG. 10B, the controller determines whether the unacceptable temperature value is too hot 1050. If "yes", then cool air supply vents associated with the identified zone are ascertained 1055. In addition, any rack/system associated with the identified zone generating excess heat is identified 1060. The controller determines whether cool air supply vent adjustments are needed to facilitate cooling the identified zone 1070, and determines any rack/system exhaust vent adjustments for the identified zone 1075, before returning to FIG. 10A, where called. If the unacceptable temperature is too cold, then in one embodiment, the controller may determine that the cool air supply vents associated with the identified zone are to be reset to their default position 1080, and that the exhaust vents associated with the identified zone are to be set to their default position 1085, before returning to FIG. 10A.

Continuing with FIG. 10A, the desired vent changes are applied to one or more identified vents associated with the identified zone with the unacceptable temperature value 1025, and the controller then determines whether all identified zones have been considered 1030. If "no", then a next identified zone is selected for processing, and the controller returns to consider whether for that zone, there is an unacceptable temperature value 1015. Once all identified zones have been considered, the controller may wait a defined time interval t 1040 before repeating the process by obtaining the current feedback parameters for the different zones of the data center 1005.

Figure 11:
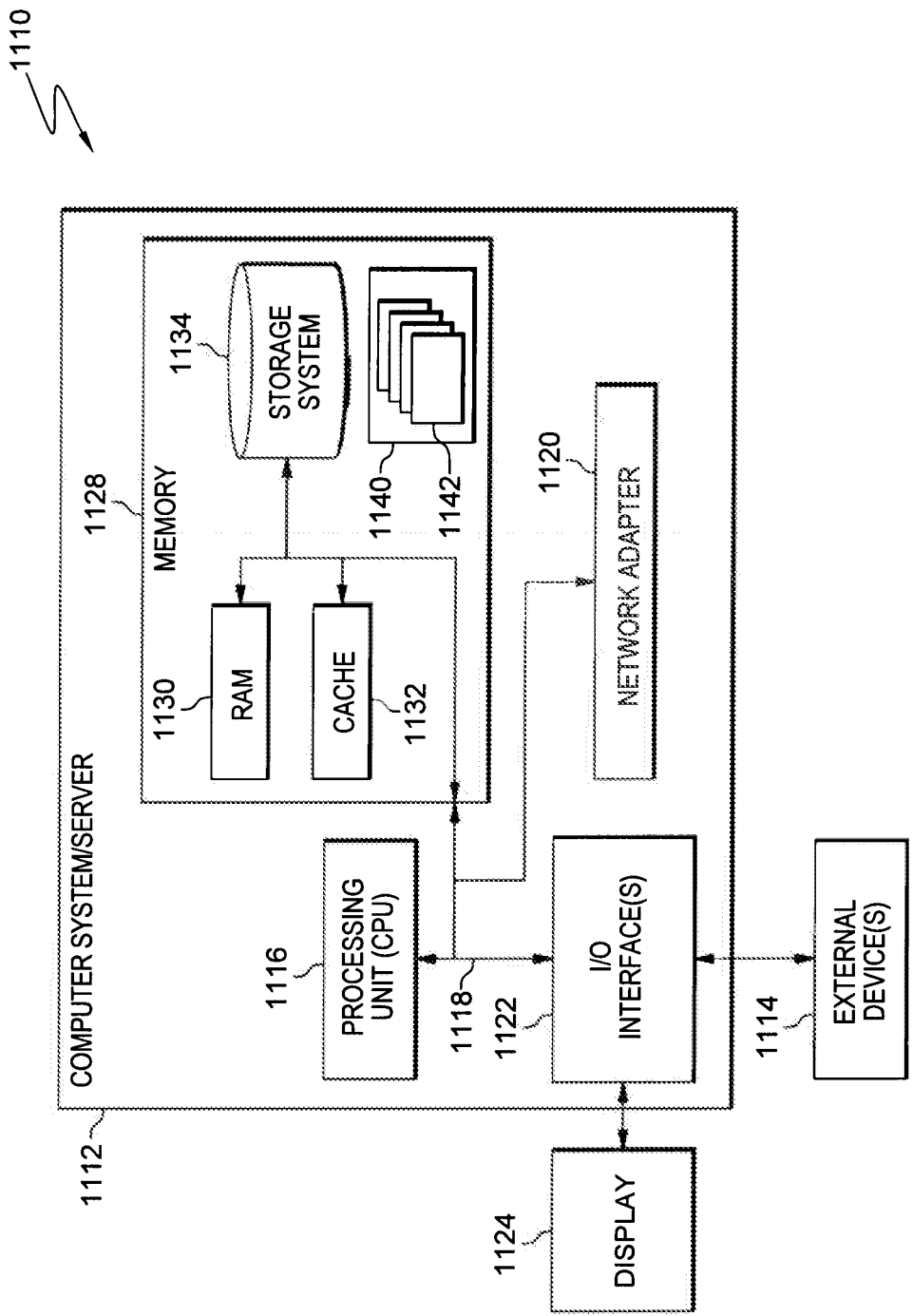
FIG. 11 depicts one embodiment of a data processing system to implement one or more aspects of the present invention.

Referring now to FIG. 11, a schematic of an example of a data processing system 1110 is shown. Data processing system 1110 is only one example of a suitable data processing system and is not intended to suggest any limitation as to the scope of use or functionality of embodiments of the invention described herein. Regardless, data processing system 1110 is capable of being implemented and/or performing any of the functionality set forth herein above, such as the adaptive ventilation system controller (e.g., centralized thermal management controller) functionality discussed.

In data processing system 1110 there is a computer system/server 1112, which is operational with numerous other general purpose or special purpose computing system environments or configurations. Examples of well-known computing systems, environments, and/or configurations that may be suitable for use with computer system/server 1112 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 1112 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1112 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 11, computer system/server 1112 in data processing system 1110 is shown in the form of a general-purpose computing device. The components of computer system/server 1112 may include, but are not limited to, one or more processors or processing units 1116, a system memory 1128, and a bus 1118 that couples various system components including system memory 1128 to processor 1116.

Bus 1118 represents one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), Micro Channel Architecture (MCA), Enhanced ISA (EISA), Video Electronics Standards Association (VESA), and Peripheral Component Interconnect (PCI).

Computer system/server 1112 typically includes a variety of computer system readable media. Such media may be any available media that is accessible by computer system/server 1112, and it includes both volatile and non-volatile media, removable and non-removable media.

System memory 1128 can include computer system readable media in the form of volatile memory, such as random access memory (RAM) 1130 and/or cache memory 1132. Computer system/server 1112 may further include other removable/non-removable, volatile/non-volatile computer system storage media. By way of example only, storage system 1134 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1118 by one or more data media interfaces. As will be further depicted and described below, memory 1128 may include at least one program product having a set (e.g., at least one) of program modules that are configured to carry out the functions of embodiments of the invention.

Program/utility 1140, having a set (at least one) of program modules 1142, may be stored in memory 1128 by way of example, and not limitation, as well as an operating system, one or more application programs, other program modules, and program data. Each of the operating system, one or more application programs, other program modules, and program data or some combination thereof, may include an implementation of a networking environment. Program modules 1142 generally carry out the functions and/or methodologies of embodiments of the invention as described herein.

Computer system/server 1112 may also communicate with one or more external devices 1114 such as a keyboard, a pointing device, a display 1124, etc.; one or more devices that enable a user to interact with computer system/server 1112; and/or any devices (e.g., network card, modem, etc.) that enable computer system/server 1112 to communicate with one or more other computing devices. Such communication can occur via Input/Output (I/O) interfaces 1122. Still yet, computer system/server 1112 can communicate with one or more networks such as a local area network (LAN), a general wide area network (WAN), and/or a public network (e.g., the Internet) via network adapter 1120. As depicted, network adapter 1120 communicates with the other components of computer system/server 1112 via bus 1118. It should be understood that although not shown, other hardware and/or software components could be used in conjunction with computer system/server 1112. Examples, include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of aspects of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The descriptions of the various embodiments of aspects of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
  an adaptive ventilation system for a data center containing a plurality of electronics racks arranged with at least one cold-air aisle and at least one hot-air aisle defined, at least in part, by the plurality of electronics racks, the adaptive ventilation system comprising:
    multiple system-controlled vents within the data center, the multiple system-controlled vents being adjustable to facilitate dynamic redirection of airflow passing therethrough;
    a plurality of sensors dispersed within the data center for ascertaining at least one feedback parameter within different zones of the data center, one sensor of the plurality of sensors being associated with one electronics rack of the plurality of electronics racks;
    a controller automatically managing adjustment of identified vents of the multiple system-controlled vents based on the ascertained at least one feedback parameter determined, in part, from the one sensor associated with the one electronics rack of the plurality of electronics racks within the data center, the automatically managing comprising automatically providing respective desired airflow discharge adjustments to the identified vents of the multiple system-controlled vents based, at least in part, on the ascertained at least one feedback parameter; and
    wherein the identified vents comprise a cool air supply vent within a cold-air aisle of the at least one cold-air aisle of the data center and an adjustable exhaust vent coupled to the one electronics rack at an air-outlet side of the one electronics rack within the data center, the cool air supply vent within the cold-air aisle providing, at least in part, cold air to the one electronics rack, and the adjustable exhaust vent exhausting hot air from the one electronics rack into a hot-air aisle of the at least one hot-air aisle of the data center, and wherein the controller automatically manages adjustment of the identified vents of the multiple system-controlled vents to dynamically optimize airflow patterns within the data center in both the cold-air aisle at the air-inlet side of the one electronics rack and the hot-air aisle at the air-outlet side of the electronics rack to enhance data center airflow cooling efficiency, the dynamically optimizing including adjusting orientation of the exhausting hot air from the one electronics rack based on the exhausting hot air having an airflow rate above a set threshold.

2. The apparatus of claim 1, wherein the controller automatically manages adjustment of the identified vents based on changes in the ascertained at least one feedback parameter over time within at least one zone of the data center.

3. The apparatus of claim 1, wherein the controller automatically, periodically polls the plurality of sensors for current values of the at least one feedback parameter within the different zones of the data center, and based thereon determines whether to automatically provide the respective desired airflow discharge adjustments to the identified vents.

4. The apparatus of claim 1, wherein the at least one feedback parameter comprises at least one of temperature within the data center, speed of one or more air-moving devices within the plurality of electronics racks, or measured or projected workload data for the plurality of electronics racks.

5. The apparatus of claim 1, wherein the controller determines the respective desired airflow discharge adjustments to at least one of optimize a distribution of cool air supply within at least one cold-air-aisle of the data center, or optimize a hot air exhaust pattern within at least one hot-air-aisle of the data center.

6. The apparatus of claim 1, wherein the controller identifies at least one zone within the data center within which to provide the respective desired airflow discharge adjustments, the at least one zone comprising a feedback parameter value outside a desired range, and the controller automatically determining for the at least one zone the respective desired airflow discharge adjustments to the identified vents.

7. The apparatus of claim 6, wherein the controller automatically determines that a temperature value of the at least one zone of the data center is outside a desired temperature range.

8. The apparatus of claim 1, wherein the cool air supply vent of the identified vents is adjusted to change a supply of cool air to at least one electronics rack of the one electronics rack and another electronics rack of the plurality of electronics racks.

9. The apparatus of claim 8, wherein the one electronics rack and the another electronics rack currently have different cooling requirements based, at least in part, on the ascertained at least one feedback parameter, and wherein the controller automatically adjusts the cool air supply vent to distribute more cool air to the one electronics rack than to the another electronics rack.

10. The apparatus of claim 8, wherein the cool air supply vent comprises multiple, separately adjustable regions of louvers, and wherein the automatically managing by the controller comprises differently orienting louvers in a first region and a second region of the multiple, separately adjustable regions of louvers of the cool air supply vent based, at least in part, on the sensed at least one parameter, the differently orienting allowing more cool air to discharge through the first region than the second region.

11. A data center comprising:
a plurality of electronics racks, the plurality of electronics racks arranged with at least one cold-air aisle and at least one hot-air aisle, and being, at least partially, air-cooled via airflow passing therethrough from an air inlet side to an air outlet side; and
an adaptive ventilation system, the adaptive ventilation system comprising:
multiple system-controlled vents within the data center, the multiple system-controlled vents being adjustable to facilitate dynamic redirection of airflow passing therethrough;
a plurality of sensors dispersed within the data center for ascertaining at least one feedback parameter within different zones of the data center, one sensor of the plurality of sensors being associated with one electronics rack of the plurality of electronics racks;
a controller automatically managing adjustment of identified vents of the multiple system-controlled vents based on the ascertained at least one feedback parameter determined, in part, from the one sensor associated with the one electronics rack of the plurality of electronics racks within the data center, the automatically managing comprising automatically providing respective desired airflow discharge adjustments to the identified vents of the multiple system-controlled vents based, at least in part, on the ascertained at least one feedback parameter; and
wherein the identified vents comprise a cool air supply vent within a cold-air aisle of the at least one cold-air aisle of the data center and an adjustable exhaust vent coupled to the one electronics rack at an air-outlet side of the one electronics rack within the data center, the cool air supply vent within the cold-air aisle providing, at least in part, cold air to the one electronics rack, and the adjustable exhaust vent exhausting hot air from the one electronics rack into a hot-air aisle of the at least one hot-air aisle of the data center, and wherein the controller automatically manages adjustment of the identified vents of the multiple system-controlled vents to dynamically optimize airflow patterns within the data center in both the cold-air aisle at the air-inlet side of the one electronics rack and the hot-air aisle at the air-outlet side of the electronics rack to enhance data center airflow cooling efficiency, the dynamically optimizing including adjusting orientation of the exhausting hot air from the one electronics rack based on the exhausting hot air having an airflow rate above a set threshold.

12. The data center of claim 11, wherein the controller automatically manages adjustment of the identified vents based on changes in the ascertained at least one feedback parameter over time within at least one zone of the data center.

13. The data center of claim 11, wherein the controller automatically, periodically polls the plurality of sensors for current values of the at least one feedback parameter within the different zones of the data center, and based thereon determines whether to automatically provide the respective desired airflow discharge adjustments to the identified vents.

14. The data center of claim 11, wherein the at least one feedback parameter comprises at least one of temperature within the data center, speed of one or more air-moving devices within the plurality of electronics racks, or measured or projected workload data for the plurality of electronics racks.

15. The data center of claim 11, wherein the controller determines the respective desired airflow discharge adjustments to at least one of optimize a distribution of cool air supply within at least one cold-air-aisle of the data center, or optimize a hot air exhaust pattern within at least one hot-air-aisle of the data center.

16. The data center of claim 11, wherein the controller identifies at least one zone within the data center within which to provide the respective desired airflow discharge adjustments, the at least one zone comprising a feedback parameter value outside a desired range, and the controller automatically determining for the at least one zone the respective desired airflow discharge adjustments to the identified vents.

* * * * *